(12) United States Patent
Kim et al.

(10) Patent No.: US 8,476,700 B2
(45) Date of Patent: Jul. 2, 2013

(54) SEMICONDUCTOR DEVICE AND METHOD OF FABRICATING THE SAME

(75) Inventors: Young-Mok Kim, Suwon-si (KR); Sun-Hak Lee, Anyang-si (KR); Tae-Cheol Lee, Yongin-si (KR); Yong-Sang Jeong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 292 days.

(21) Appl. No.: 12/656,671

(22) Filed: Feb. 12, 2010

(65) Prior Publication Data

US 2010/0207204 A1    Aug. 19, 2010

(30) Foreign Application Priority Data

Feb. 13, 2009  (KR) ........................ 10-2009-0011970

(51) Int. Cl.
   *H01L 29/66*  (2006.01)
(52) U.S. Cl.
   USPC .................................. 257/330; 257/E29.262
(58) Field of Classification Search
   USPC ....................................................... 257/330
   See application file for complete search history.

(56) References Cited

U.S. PATENT DOCUMENTS

| 6,344,393 | B1 * | 2/2002 | Liu ................................ 438/259 |
| 7,205,208 | B2 | 4/2007 | Kim et al. |
| 2006/0273388 | A1 * | 12/2006 | Yamazaki ..................... 257/330 |
| 2008/0017904 | A1 | 1/2008 | Akiyama |

FOREIGN PATENT DOCUMENTS

| EP | 1786031 | * | 6/2007 |
| JP | 2008-028055 | A | 2/2008 |
| KR | 10-0264728 | B1 | 6/2000 |
| KR | 10-2005-0116541 | A | 12/2005 |
| KR | 10-2007-0016419 | A | 2/2007 |
| KR | 10-2007-0064163 | A | 6/2007 |
| KR | 10-0744654 | B1 | 7/2007 |
| KR | 10-2008-0001926 | A | 1/2008 |
| KR | 10-2008-0061980 | A | 7/2008 |

* cited by examiner

*Primary Examiner* — Edward Wojciechowicz
(74) *Attorney, Agent, or Firm* — Lee & Morse, P.C.

(57) ABSTRACT

A semiconductor device comprises a recessed trench in a substrate, a gate insulating layer including a first portion and a second portion, the first portion having a first thickness and covering lower portions of sidewalls of the recessed trench and a bottom surface of the recessed trench, and the second portion having a second thickness and covering upper portions of the sidewalls of the recessed trench, the second thickness being greater than the first thickness, a gate electrode filling the recessed trench, a first impurity region having a first concentration and disposed at opposing sides of the gate electrode, and a second impurity region having a second concentration greater than the first concentration and disposed on the first impurity region to correspond to the second portion of the gate insulating layer.

6 Claims, 28 Drawing Sheets

SEMICONDUCTOR DEVICE AND METHOD OF FABRICATING THE SAME

BACKGROUND

1. Field

Example embodiments relate to a semiconductor device and a method of fabricating the same. More particularly, example embodiments relate to a semiconductor device having improved electrical characteristics, and a method of fabricating the semiconductor device.

2. Description of the Related Art

A nonvolatile semiconductor device, e.g., a display driver IC (DDI), may require high voltage transistors operating at a relatively high voltage, e.g., voltage greater than about 12 V, and/or low voltage transistors. The high voltage transistors may be categorized into high-voltage transistors having recessed trench channels and high-voltage transistors having planar channels.

SUMMARY

Embodiments are directed to a semiconductor device and a method of fabricating the same, which substantially overcome one or more of the problems due to the limitations and disadvantages of the related art.

It is therefore a feature of an embodiment to provide a semiconductor device having improved electrical characteristics.

It is therefore another feature of an embodiment to provide a method of fabricating a semiconductor device having improved electrical characteristics.

At least one of the above and other features and advantages may be realized by providing a semiconductor device, including a recessed trench formed in a substrate, a gate insulating layer including a first region having a first thickness and formed to cover lower portions of sidewalls of the recessed trench and a bottom surface of the recessed trench, and a second portion having a second thickness greater than the first thickness, and formed to cover upper portions of the sidewalls of the recessed trench, a gate electrode filling the recessed trench, a first impurity region having a first concentration and disposed at opposing sides of the gate electrode, and a second impurity region having a second concentration greater than the first concentration and disposed on the first impurity region to correspond to the second portion.

A bottom surface of the second impurity region may be disposed above an interfacial area between the first and second portions. A distance between the interfacial area and the bottom surface of the second impurity region may be about 0.32 µm to about 0.42 µm. A ratio of a depth of the second portion of the gate insulating layer to a depth of the recessed trench may be about 0.67 to about 0.8, the depth of the second portion being measured from an upper surface of the substrate to a bottom surface of the second portion, and the depth of the recessed trench being measured from the upper surface of the substrate to a bottom surface of the recessed trench. A bottom surface of the first impurity region may be disposed below an interfacial area between the first and second portions.

At least one of the above and other features and advantages may also be realized by providing a semiconductor device, including a first region, a second region, and a third region divided by an isolation region to be defined on a substrate, a recessed trench formed in the first region, a high voltage recess channel transistor including a first gate insulating layer formed on the surface, and sidewalls and a bottom surface of the recessed trench and having a first portion with a first thickness and a second portion with a second thickness greater than the first thickness, a high voltage recess gate electrode formed on the first gate insulating layers and filling the recessed trench, a first impurity region having a first concentration and disposed at opposing sides of the high voltage recess gate electrode, and a second impurity region having a second concentration greater than the first concentration and disposed on the first impurity region corresponding to the second portion, a low voltage planar channel transistor including a second gate insulating layer formed on a surface of the second region of the substrate and having a third thickness smaller than the first thickness, a low voltage gate electrode formed on the second gate insulating layer, and including a third impurity region formed at opposing sides of the low voltage gate electrode, and a high voltage planar channel transistor formed in a third region of the substrate.

At least one of the above and other features and advantages may also be realized by providing a method of fabricating a semiconductor device, the method including forming a recessed trench in a substrate, forming a gate insulating layer including a first region having a first thickness and covering lower portions of sidewalls of the recessed trench and a bottom surface of the recessed trench, and a second portion having a second thickness greater than the first thickness and covering upper portions of the sidewalls of the recessed trench, forming a gate electrode filling the recessed trench, and forming a first impurity region having a first concentration and disposed at opposing sides of the gate electrode, and a second impurity region having a second concentration greater than the first concentration and disposed on the first impurity region to correspond to the second portion.

Forming the gate insulating layer may include forming a second-portion reserve part of the gate insulating layer only on the sidewalls of the recessed trench, forming a high voltage insulating layer having the first thickness, such that the high voltage insulating layer covers a surface of the substrate, the second-portion reserve part of the gate insulating layer, and the lower portions of the sidewalls and bottom surface of the recessed trench. Forming the second-portion reserve part may include completely filling the recessed trench using an insulating layer, and partially removing the filled insulating layer using a hard mask layer having a width smaller than that of the recessed trench. Partially removing the filled insulating layer may include removing the filled insulating layer to a first depth smaller than that of the recessed trench, such that an upper surface of a remaining insulating layer in the recessed trench defines a first depth, forming a nitride layer on the hard mask layer and on the first depth of the remaining insulating layer, etching back the nitride layer, and removing the remaining insulating layer from the recessed trench, excluding the second-portion reserve part. Removing the remaining insulating layer may include removing the remaining insulating layer from a bottom surface of the recessed trench by dry etching the remaining insulating layer, and removing the remaining insulating layer from lower portions of the sidewalls of the recessed trench by wet etching using the nitride layer as an etch mask.

Forming the second-portion reserve part may include forming a reserve recessed trench to a second depth smaller than that of the recessed trench, forming a reserve insulating layer conformally on the surface of the substrate and the reserve recessed trench, and forming the recessed trench by etching the reserve recessed trench. Forming the recessed trench may include exposing a bottom surface of the reserve recessed trench by etching back the reserve insulating layer, and forming the recessed trench by etching the bottom surface of the reserve recessed trench. The method may further include forming an isolation region in the substrate, such that the recessed trench and a trench for the isolation region are simultaneously formed by etching the substrate. Forming the isolation region may include completely filling the recessed trench and the trench for the isolation region simultaneously using an insulating layer. Simultaneously forming the recessed trench and the trench for the isolation region may include forming a reserve trench for the isolation region by etching the substrate, and simultaneously etching the reserve trench for the isolation region and the substrate. The method may further include, before forming the recessed trench, forming a trench for an isolation region in the substrate, and forming an isolation region by filling the trench for the isolation region with an insulating layer.

At least one of the above and other features and advantages may also be realized by providing a method of fabricating a semiconductor device, the method including forming an isolation region defining a first region, a second region, and a third region on a substrate, and a recessed trench in the first region, forming a high voltage recess channel transistor including a first gate insulating layer on the surface, and sidewalls and a bottom surface of the recessed trench and having a first portion with a first depth and a second portion with a second depth greater than the first depth, a high voltage recess gate electrode on the first gate insulating layers and filling the recessed trench, a first impurity region having a first concentration and disposed at opposing sides of the high voltage recess gate electrode, and a second impurity region having a second concentration greater than the first concentration and disposed on the first impurity region corresponding to the second portion, forming a low voltage planar channel transistor including a second gate insulating layer on a surface of the second region of the substrate and having a third thickness smaller than the first thickness, a low voltage gate electrode on the second gate insulating layer, and including a third impurity region at opposing sides of the low voltage gate electrode, and forming a high voltage planar channel transistor formed in a third region of the substrate.

Forming the high voltage planar channel transistor may include forming a third gate insulating layer on a surface of the third region of the substrate to have a first thickness, forming a high voltage gate electrode on the third gate insulating layer, and forming a fourth impurity region at opposing sides of the high voltage gate electrode. Forming the gate insulating layer may include forming a second-portion reserve part of the gate insulating layer only on upper portions of the sidewalls of the recessed trench, and forming a high voltage insulating layer to have the first thickness, such that the high voltage insulating layer covers a surface of the substrate, the second-portion reserve part of the gate insulating layer, and the lower portions of the sidewalls and bottom surface of the recessed trench. The method may further include, after forming the high voltage insulating layer, removing the high voltage insulating layer from the second region, and forming a low voltage insulating layer in the second region. The method may further include depositing a conductive material on the high voltage insulating layer and the low voltage insulating layer, and forming a high voltage recess gate electrode in the first region, a low voltage gate electrode in the second region, and a high voltage gate electrode in the third region by patterning the conductive material.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
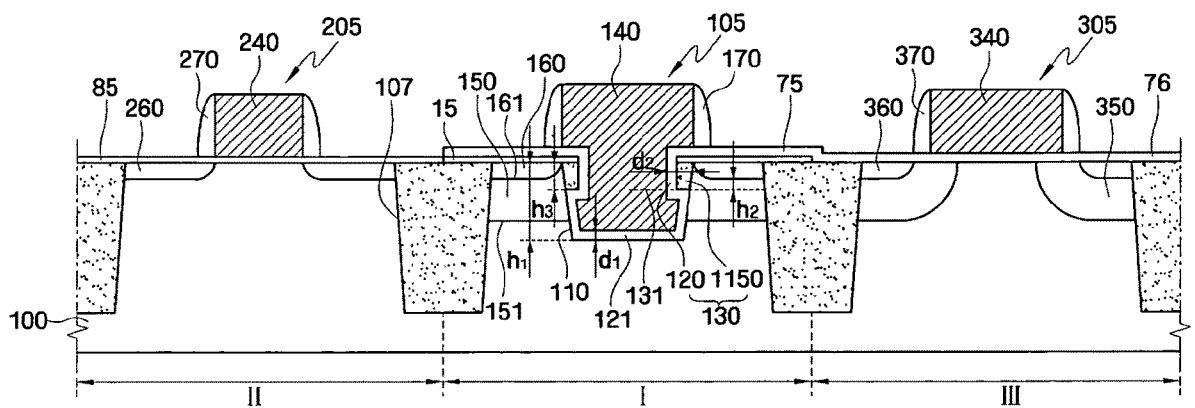
FIG. 1 illustrates a cross-section view of a semiconductor device according to an example embodiment.

Korean Patent Application No. 10-2009-0011970, filed on Feb. 13, 2009, in the Korean Intellectual Property Office, and entitled: "Semiconductor Device and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concept.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, as used herein, the term "A or B" includes "A", "B", "A and B." Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a semiconductor device according to an embodiment will be described with reference to FIG. 1. FIG. 1 illustrates a cross-sectional view of a semiconductor device according to a first embodiment.

Referring to FIG. 1, a semiconductor substrate may be divided into a first region (I), a second region (II), and a third region (III) defined on a substrate 100 by an isolation region 107. The isolation region 107 may be formed by filling a trench for an isolation region using, e.g., an oxide for STI (Shallow Trench Isolation) or FOX (Field OXide).

A high voltage recess channel transistor 105, a low voltage planar channel transistor 205, and a high voltage planar channel transistor 305 may be arranged in the first region I, the second region II, and the third region III, respectively.

The substrate 100 may be a semiconductor substrate made of at least one of Ge, SiGe, GaP, GaAs, SiC, SiGeC, InAs, and InP, a SOI (Silicon On Insulator) substrate, a quartz substrate, a glass substrate for a display, or any other rigid substrate. Additionally or alternatively, the substrate 100 may be a flexible plastic substrate made of, e.g., polyimide, PET (PolyEthylene Terephthalate), PEN (PolyEthylene Naphthalate), PMMA (Poly Methyl MethAcrylate), PC (PolyCarbonate), PES, polyester, and the like.

The high voltage recess channel transistor 105 may include a recessed trench 110 that is inwardly recessed from a surface of the substrate 100, a first gate insulating layer on the substrate 100, a high voltage recess gate electrode 140 on the first gate insulating layer and filling the recessed trench 110, a first impurity region 150 having a first concentration and disposed at opposing sides of the high voltage recess gate electrode 140, and a second impurity region 160 having a second concentration and disposed on the first impurity region 150. The first gate insulating layer may include a first portion 121, a second portion 130, a third portion 15, and a fourth portion 75.

The recessed trench 110 may be formed to have a predetermined first depth h1 to provide for a sufficiently long channel length of the high voltage recess channel transistor 105. The first depth h1 of the recessed trench 110 may be smaller than or equal to a height of the isolation region 107.

The first gate insulating layer may include the first portion 121, the second portion 130, the third portion 15, and the fourth portion 75. The first portion 121 of the first gate insulating layer may be formed to cover lower portions of the sidewalls of the recessed trench 110 and a bottom surface of the recessed trench 110. The second portion 130 of the first gate insulating layer may be formed to cover an upper portion of the sidewalls of the recessed trench 110, e.g., directly on the first portion 121. The third portion 15 of the first gate insulating layer may be formed on an upper surface of the substrate 100. The fourth portion 75 of the first gate insulating layer may be formed on the upper surface of the substrate 100, e.g., to cover the third portion 15 of the first gate insulation layer, and on upper portions of the sidewalls of the recessed trench 110.

The first portion 121 of the first gate insulating layer may be formed to have a first thickness d1, and the second portion 130 of the first gate insulating layer may be formed to have a second thickness d2 greater than the first thickness d1. A combined thickness of the third and fourth portions 15 and 75 of the first gate insulating layer may be greater than the first thickness d1. In consideration of electrical characteristics of the high voltage recess channel transistor 105, the first thickness d1 may be in a range of, e.g., about 200 Å to about 300 Å, and the second thickness d2 may be in a range of, e.g., about 0.1 μm to about 0.2 μm.

The first portion 121 of the first gate insulating layer may be formed of an oxide layer, and may also be used with an oxynitride layer having an etch selectivity with respect to a nitride. For example, the first portion 121 of the first gate insulating layer may be a silicon oxide layer, e.g., SiON, $Ge_xO_yN_z$, $Ge_xSi_yO_z$, a high-k dielectric layer, a combination thereof, or a laminated layer thereof. Here, examples of the high-k dielectric layer may include hafnium dioxide ($HfO_2$), zirconium oxide ($ZrO_2$), aluminum oxide ($Al_2O_3$), tantalum pentoxide ($Ta_2O_5$), hafnium silicate ($HfSiO_4$), zirconium silicate ($ZrSiO_4$), and a combination of these layers.

The second portion 130 of the first gate insulating layer may include a second-portion reserve part 1150 and a high voltage insulating layer 120. The second-portion reserve part 1150 may be formed on, e.g., directly on, upper portions of the sidewalls of the recessed trench 110, and the high voltage insulating layer 120 may be formed on, e.g., directly on, the second-portion reserve part 1150. For example, the second-portion reserve part 1150 may extend from an inner wall of the recessed trench 110 toward an interior of the recessed trench 110 to have a predetermined width, and an upper surface of the second-portion reserve part 1150 may be substantially coplanar with an upper surface of the substrate 100. A bottom surface, e.g., bottommost portion, of the second-portion reserve part 1150, i.e., a surface of the second-portion reserve part 1150 opposite the upper surface and facing the first portion 121, may define a bottom of the second portion 130. Therefore, an interface between the bottom of the second-portion reserve part 1150 and the first portion 121 may define an interfacial area 131 between the first and second portions 121 and 130 of the first gate insulating layer. The second-portion reserve part 1150 may be made of the same insulating material as the material filling the isolation region 107. The high voltage insulating layer 120 may be made of the same material as the first portion 121 of the first gate insulating layer.

The recessed trench 110 may have the first depth h1, i.e., as measured from the upper surface of the substrate 100 to a bottom surface of the recessed trench 110, as illustrated in FIG. 1. The second portion 130 may have a third depth h3, i.e., as measured from the upper surface of the substrate 100 to a bottom surface of the second portion 130, as illustrated in FIG. 1. In consideration of the breakdown voltage and threshold voltage of the high voltage recess channel transistor 105, a ratio of the third depth h3 to the first depth h1 may be in a range of about 0.65 to about 0.8, as will be described in more detail below.

The high voltage recess gate electrode 140 may be formed on the first gate insulating layer to bury the recessed trench 110. The high voltage recess gate electrode 140 may completely fill the recessed trench 110, and a portion of the high voltage recess gate electrode 140 may be on the upper surface of the substrate 100, e.g., protrude above the upper surface of the substrate 100.

The high voltage recess gate electrode 140 may be made of polysilicon or a stack of polysilicon and a metal, e.g., tungsten (W). An N-type or P-type impurity may be doped into the polysilicon. Examples of the P-type impurity may include boron (B), boron fluoride ($BF_2$), and indium (In). Exampled of the N-type impurity may include phosphorus (P) and arsenic (As).

The substrate 100 at opposing sides of the high voltage recess gate electrode 140 may include source/drain regions, i.e., the first impurity region 150 having a first concentration and the second impurity region 160 having a second concentration. For example, the first impurity region 150 may be on both sides of the high voltage recess gate electrode 140, and a second impurity region 160 may be on each first impurity region 150. The second concentration of the second impurity region 160 may be greater than the first concentration of the first impurity region 150. The second impurity region 160 may correspond, e.g., be horizontally adjacent, to the second portion 130 of the first gate insulating layer. For example, N– impurities may be ion-implanted into the first impurity region 150, and N+ impurities may be ion-implanted into the second impurity region 160. When the first impurity region 150 and the second impurity region 160 formed at one side of the high voltage recess gate electrode 140 are defined as the source, impurity regions formed at the other side of the high voltage recess gate electrode 140 may be defined as the drain.

A bottom surface 151, e.g., bottommost portion, of the first impurity region 150 may be disposed below the interfacial area 131 between the first and second portions 121 and 130 of the first gate insulating layer. In other words, a distance between the bottom surface 151 of the first impurity region 150 to a reference point on a bottom surface of the substrate 100, i.e., a surface opposite the upper surface and supporting the substrate 100, may be smaller than a distance between the interfacial area 131 and the reference point on the bottom surface on the substrate 100. Thus, the first impurity region 150 may be disposed to a sufficient depth within the substrate 100 to be adjacent to the first portion 121 horizontally, e.g., the first impurity region 150 may overlap the second portion 130 and at least a part of the first portion 121. The first portion 121 may have the first thickness d1, which is a relatively low value. In this case, the drain saturation current characteristic may be improved.

A bottom surface 161, e.g., bottommost portion, of the second impurity region 160 may be disposed above the interfacial area 131 between the first and second portions 121 and 130 of the first gate insulating layer. In other words, a distance between the bottom surface 161 of the second impurity region 160 to a reference point on the bottom surface of the substrate 100 may be larger than a distance between the interfacial area 131 and the reference point on the bottom surface on the substrate 100. Thus, the second impurity region 160 may be disposed to a depth, such that the second impurity region 160 may be horizontally adjacent only to the second portion 130 among all the portions of the gate insulating layer, e.g., the second impurity region 160 may not overlap the first portion 121 and may be spaced apart from the first portion 121. The second portion 130 may have the second thickness d2, which is a relatively large value, and spaced apart from the first portion 121. In consideration of electrical characteristics including a breakdown voltage, a threshold voltage, and so on, a second depth h2, i.e., as measured from the bottom surface 161 of the second impurity region 160 to the interfacial area 131 between the first and second portions 121 and 130, may be in a range of, e.g., about 0.32 µm to about 0.42 µm, as illustrated in FIG. 1.

It is noted that the high voltage transistor 105 having a recessed trench channel may include the second impurity region 160, i.e., a high concentration impurity region, at least partially surrounded by the first impurity region 150, i.e., a low concentration impurity region, to have a high breakdown voltage of a junction for source/drain regions. Further, electrical characteristics of the high voltage transistor 105 having the recessed trench channel, e.g., current leakage, threshold voltages, and so on, may vary according to the thickness and location of the gate insulating layer, as well as concentration and location of a junction.

A spacer 170 may be formed at both sidewalls of the high voltage recess gate electrode 140. The spacer 170 may be formed of, e.g., a nitride layer (SiN) or an oxide layer ($SiO_2$).

The low voltage planar channel transistor 205 may be formed on a surface of the second region II of the substrate 100. The low voltage planar channel transistor 205 may include a second gate insulating layer 85 having a third thickness d3 smaller than the first thickness d1, a low voltage gate electrode 240 formed on the second gate insulating layer 85, and a third impurity region 260 formed at opposing sides of the low voltage gate electrode 240. The low voltage gate electrode 240 may also have a spacer 270 formed at the opposing sides thereof, like the high voltage recess gate electrode 140.

The second gate insulating layer 85 may be made of low voltage oxide to be suitable for low voltage characteristics. The third thickness d3 may be in a range of, e.g., about 50 Å to about 60 Å in consideration of low voltage characteristics.

The low voltage gate electrode 240 may be formed on the second gate insulating layer 85, and may be planar, e.g., may not be recessed into the substrate 100. The low voltage gate electrode 240 may be made of the same material as the high voltage recess gate electrode 140.

The third impurity region 260 may be disposed in the substrate 100 formed at opposing sides of the low voltage gate electrode 240. The third impurity region 260 may overlap a lower portion of the low voltage gate electrode 240 at one side thereof. For example, the third impurity region 260 may be formed by ion-implanting N+ impurities. However, embodiments are not limited thereto, e.g., N– impurities may be ion-implanted into the third impurity region 260.

The high voltage planar channel transistor 305 may be formed in the third region III of the substrate 100. The high voltage planar channel transistor 305 may include a third gate insulating layer 76 formed on the surface of the substrate 100, a high voltage gate electrode 340 formed on the third gate insulating layer 76, and fourth impurity regions 350 and 360 formed at opposing sides of the high voltage gate electrode 340. The high voltage gate electrode 340 may also have a spacer 370 formed at the opposing sides thereof, like the high voltage recess gate electrode 140.

The third gate insulating layer 76 may have the same thickness as the first thickness d1 to be suitable for electrical characteristic of the high voltage planar channel transistor 305 having a planar channel formed therein. The high voltage gate electrode 340 may be formed on the third gate insulating layer 76 and may be planar, e.g., may not be recessed into the substrate 100. The high voltage gate electrode 340 may be made of the same material as the high voltage recess gate electrode 140.

The fourth impurity regions 350 and 360 may be disposed in the substrate 100 formed at opposing sides of the high voltage gate electrode 340. The fourth impurity regions 350 and 360 may include a first portion 350 for fourth impurity region having a third concentration, and a second portion 360 for fourth impurity region having a fourth concentration greater than the third concentration and disposed on the first portion 350. The first region 350 may overlap a lower portion of the high voltage gate electrode 340 at one side thereof. The second region 360 may be spaced a predetermined distance apart from the high voltage gate electrode 340.

Figure 2:
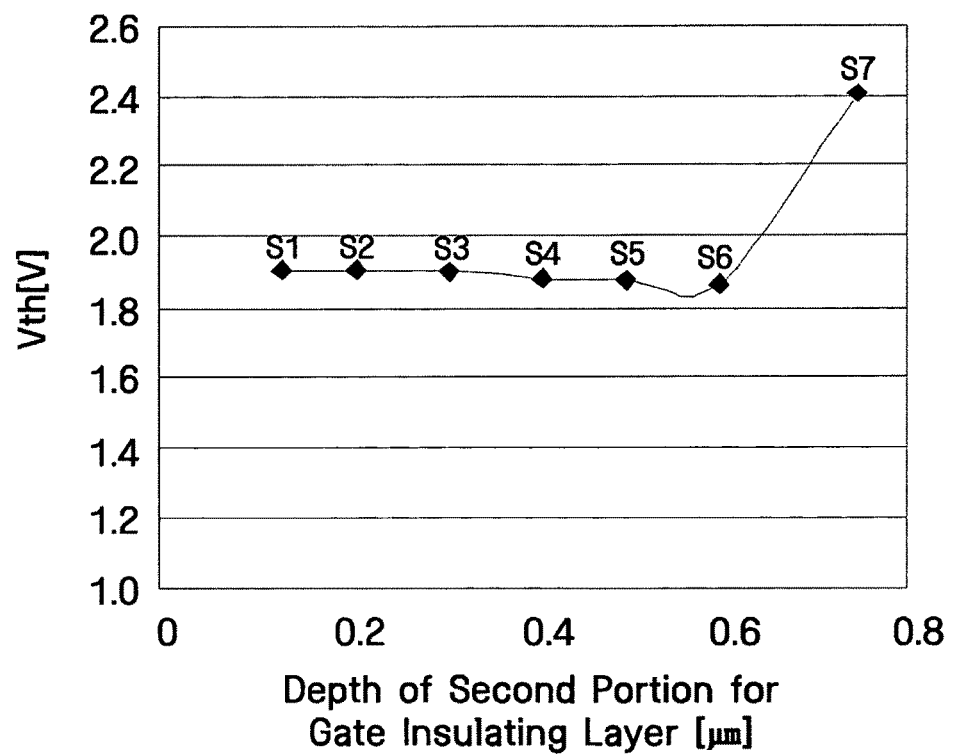
FIG. 2 illustrates a graph of threshold voltage variation according to different depths of a second portion of an insulating gate.

Hereinafter, the electrical characteristics of the semiconductor device according to the first embodiment will be described in detail with reference to FIG. 1 and FIGS. 2 through 6. FIGS. 2 and 6 illustrate graphs of electrical characteristics according to different depths of the second portion 130. FIGS. 3A-5F are SEM photographs illustrating electrical characteristics of the semiconductor device according to the first embodiment. It is noted that regions A-G in the SEM photographs correspond to red, orange, yellow, green, cyan, light blue, and dark blue colors on the SEM photographs, respectively.

The electrical characteristics of the semiconductor device according to the first embodiment were observed while varying the third depth h3 of the second portion 130, i.e., as measured form the upper surface of the substrate 100 to the bottom of the second portion 130. The first depth h1 of the recessed trench 110, a width of the recessed trench 110, the thickness d2 of the second portion 130 of the first gate insulating layer, and depths of the first and second impurity regions 150 and 160 were maintained constant.

In detail, the first depth h1 of the recessed trench 110 was set at 0.75 μm. The width of the recessed trench 110 at the upper surface of the substrate 100 was set at 0.5 μm. The thickness d2 of the second portion 130 of the first gate insulating layer was set at 0.15 μm. The depths of the first and second impurity regions 150 and 160 were set at and 0.38 μm and 0.18 μm, respectively. Under the above conditions, the third depth h3 of the second portion 130 was gradually increased, while the electrical characteristics of the semiconductor device were observed. Results are summarized in Table 1 that follows, as well as FIGS. 2 and 6.

TABLE 1

|    | h3 [μm] | Vth [V] | Idsat [μA/μm] | BV [V] | h3/h1 | h2 [μm] |
|----|---------|---------|---------------|--------|-------|---------|
| s1 | 0.13    | 1.904   | 655           | 15.8   | 0.173 | −0.05   |
| s2 | 0.21    | 1.902   | 648           | 16.5   | 0.28  | 0.03    |
| s3 | 0.31    | 1.896   | 622           | 18     | 0.413 | 0.13    |
| s4 | 0.41    | 1.882   | 573           | 19.8   | 0.547 | 0.23    |
| s5 | 0.5     | 1.873   | 515           | 20.6   | 0.67  | 0.32    |
| s6 | 0.6     | 1.863   | 478           | 20.79  | 0.8   | 0.42    |
| s7 | 0.75    | 2.404   | 420           | 20.88  | 1     | 0.57    |

In Table 1, Vth denotes a threshold voltage, Idsat denotes a drain saturation current, and BV denotes a breakdown voltage.

Referring to FIG. 2 and Table 1, the threshold voltage Vth of the high voltage recess channel transistor 105 of the semiconductor device according to the first embodiment exhibited little change even when the third depth h3 of the second portion 130 increased. However, when the third depth h3 of the second portion 130 increased sufficiently to equal the first depth h1 of the recessed trench 110, i.e., when h3/h1=1, the threshold voltage Vth of the high voltage recess channel transistor 105 abruptly increased, which is an inferior characteristic. As such, a ratio of h3/h1 between about 0.67 to about 0.8 may advantageously provide a relatively stable threshold voltage Vth.

FIGS. 3A through 3F illustrate impact ionization possibilities at various regions of the substrate 110, i.e., regions s1 through s6 in Table 1. In detail, FIGS. 3A through 3F illustrate photographs of SEM images of impact ionization at regions s1 through s6. Here, regions A-C, i.e., red series, represent high impact ionization possibilities, while regions E-G, i.e., blue series, represent low impact ionization possibilities.

Figure 3A:
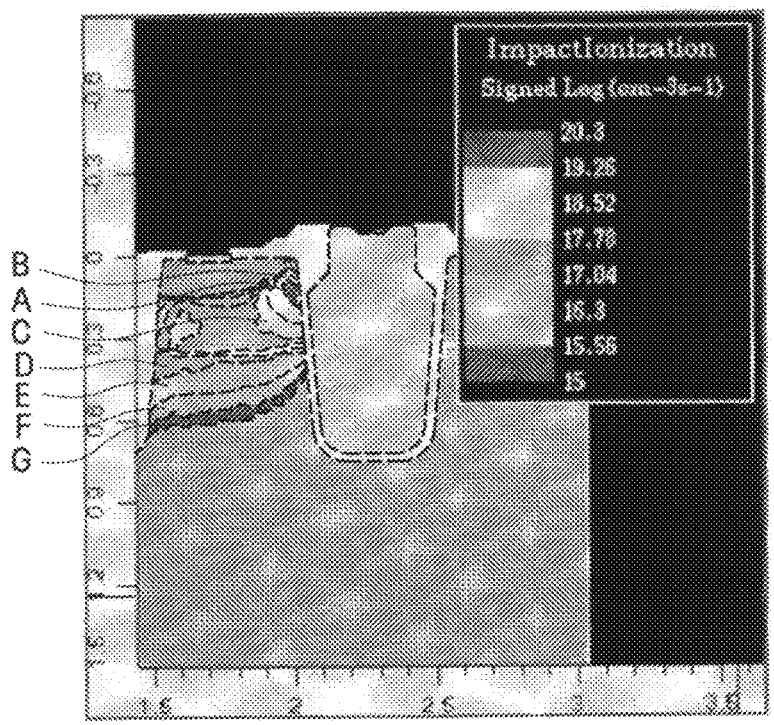
FIGS. 3A-5F illustrate scanning electron microscope (SEM) photographs of a semiconductor device according to an example embodiment and its electrical characteristics.
Figure 3B:
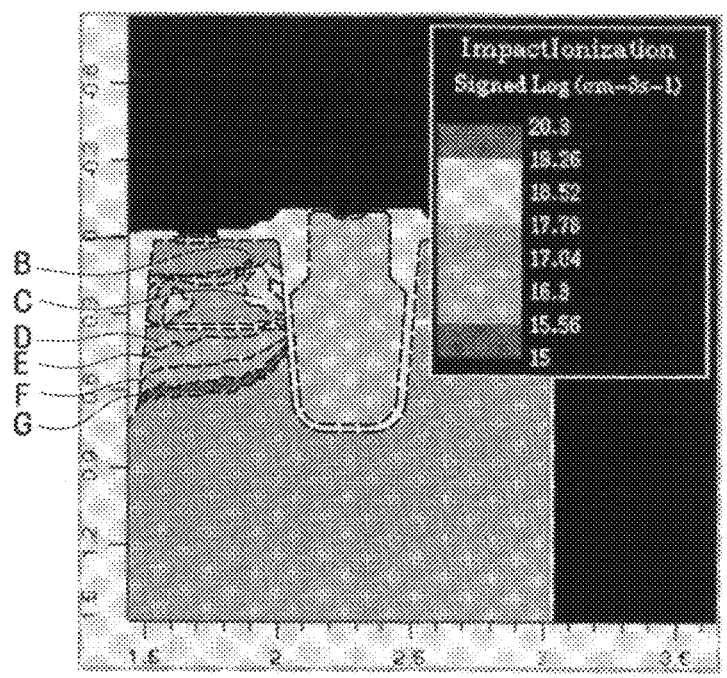
Figure 3C:
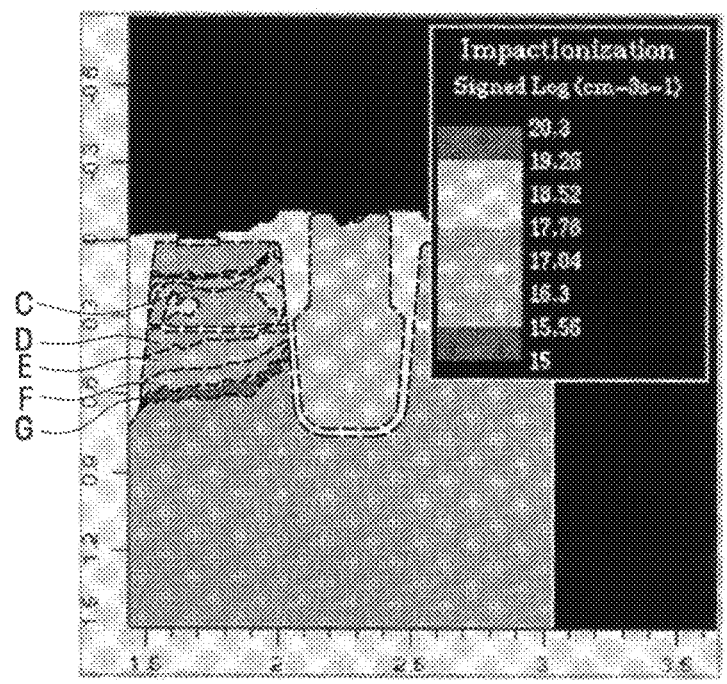
Figure 3D:
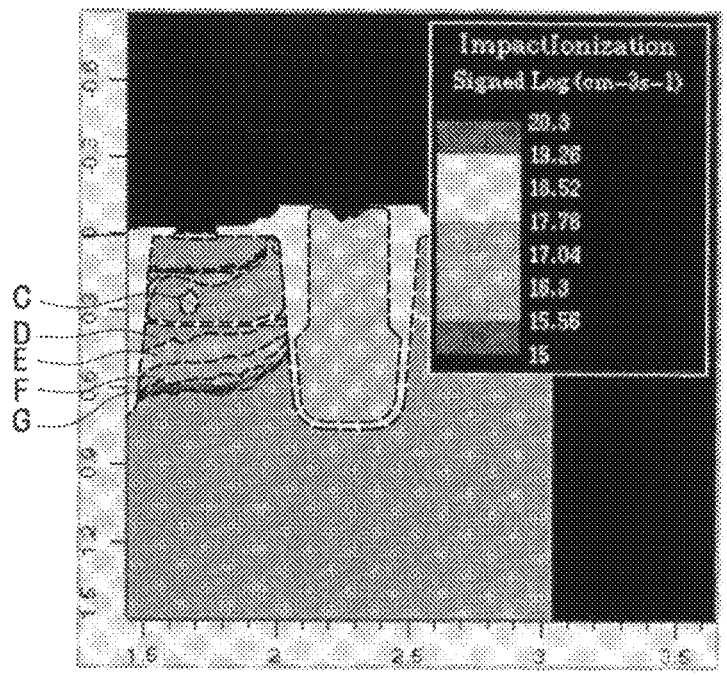
Figure 3E:
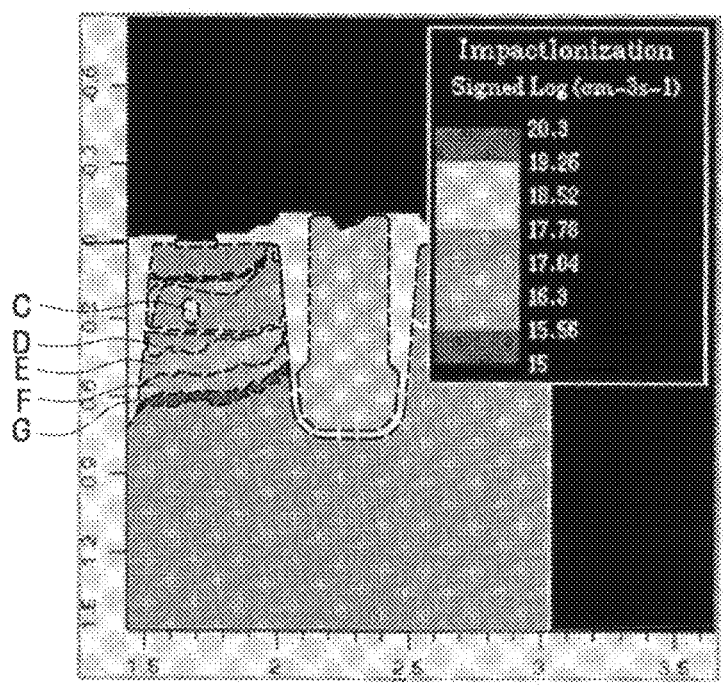
Figure 3F:
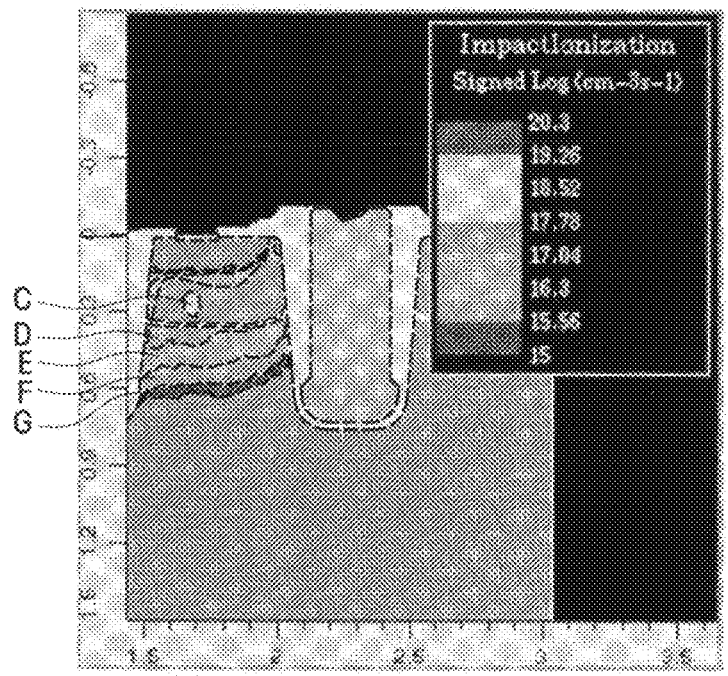

As illustrated in FIG. 3A, regions A and B are formed around the interfacial area between the first and second portions of the first gate insulating layers. In addition, as illustrated in FIG. 3B, region C is also formed around the interfacial area between the first and second portions of the first gate insulating layers. In contrast, a gradually increased area of regions E-G from FIG. 3A through FIG. 3F confirms that the impact ionization possibility becomes smaller. That is, the impact ionization possibilities in regions s1 and s2 are very high and become gradually smaller from the region s1 toward the region s6. A higher impact ionization possibility means a smaller breakdown voltage, and it is expected that the breakdown voltage characteristics deteriorate from the region s6 to the region s1.

FIGS. 4A through 4F illustrate BTBT (Band to Band Tunneling) extents at various regions of the substrate, i.e., regions s1, s2, s3, s4, s5, and s6, as illustrated in Table 1. In detail, FIGS. 4A through 4F illustrate SEM images of extents of tunneling at regions s1, s2, s3, s4, s5, and s6. Here, regions A-C, i.e., red color series, represent high tunneling possibilities, and regions E-G, i.e., blue color series, represent low tunneling possibilities.

Figure 4A:
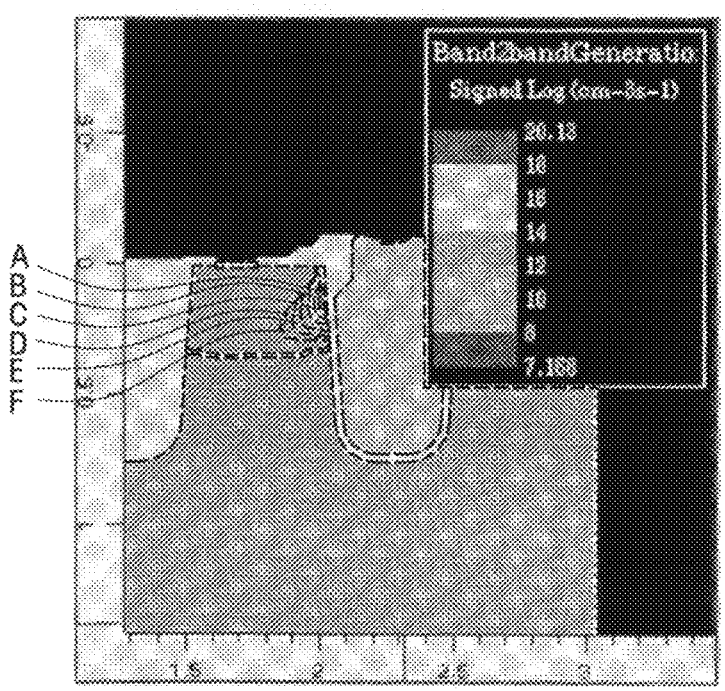
Figure 4B:
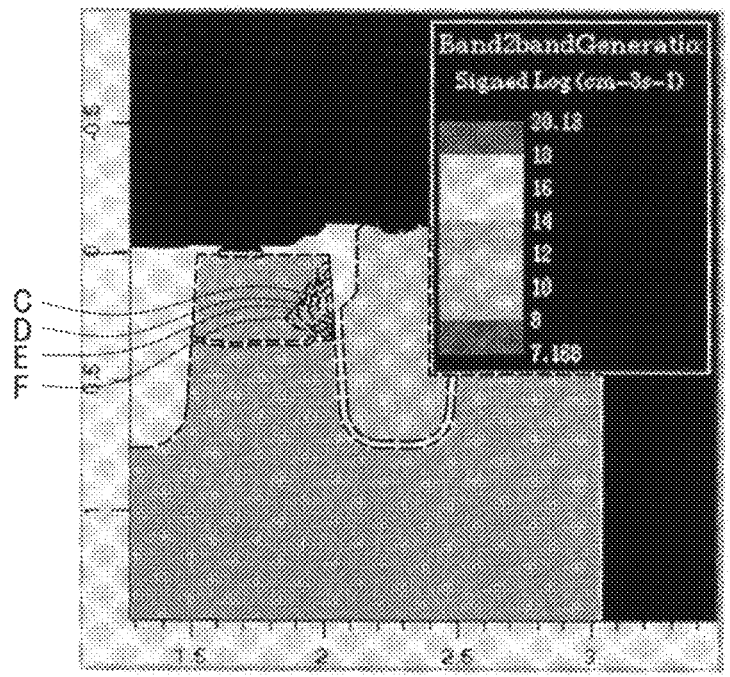
Figure 4C:
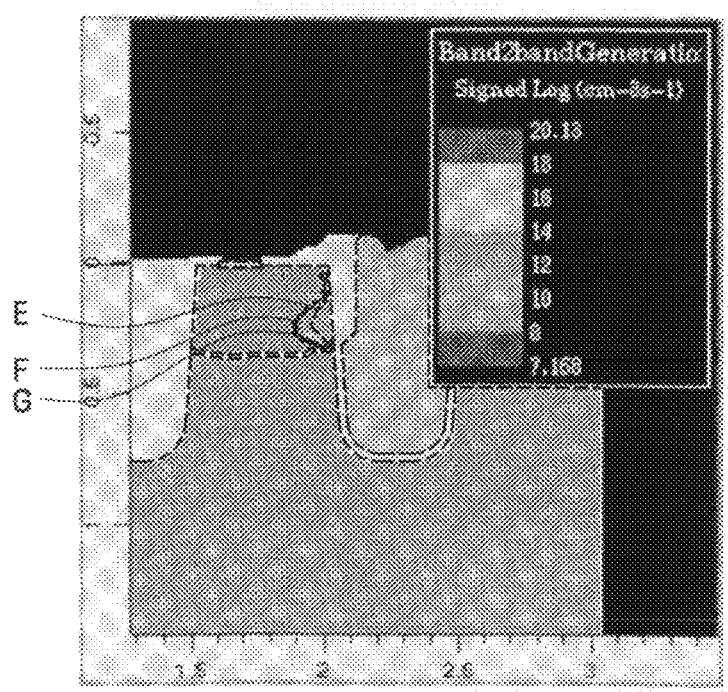
Figure 4D:
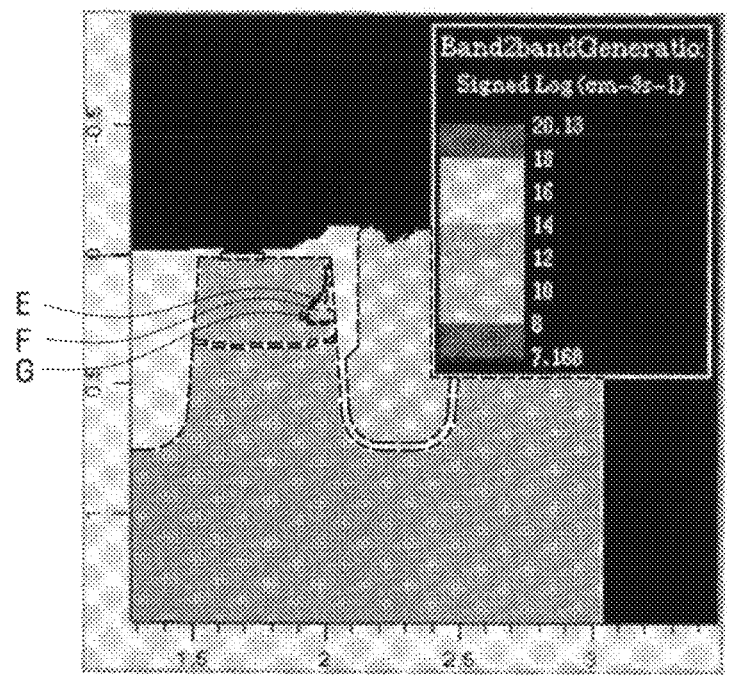
Figure 4E:
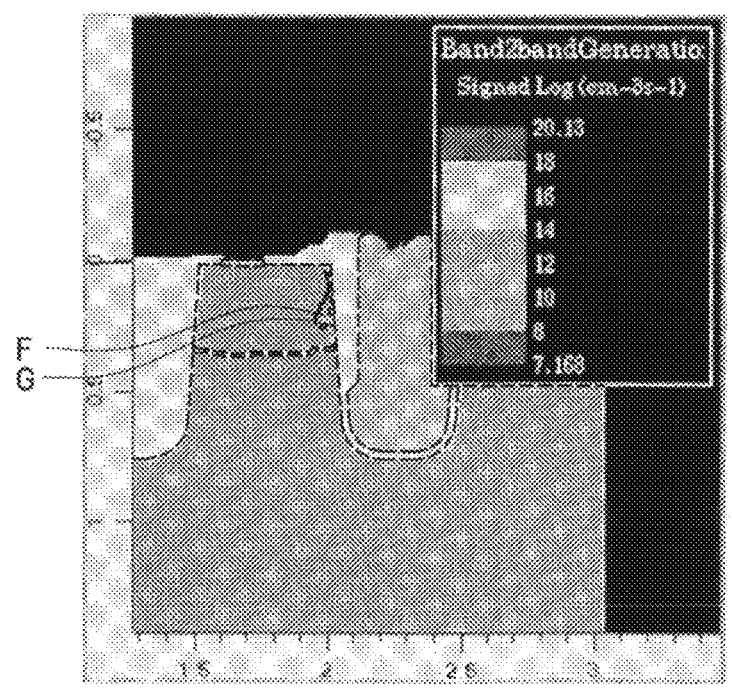
Figure 4F:
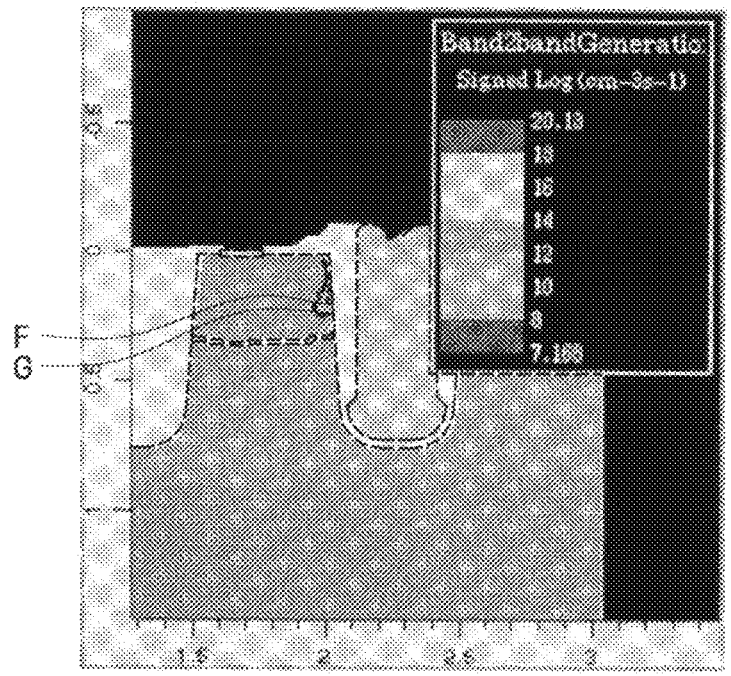

As illustrated in FIG. 4A, regions A and B are formed around the interfacial area between the first and second portions of the first gate insulating layers. When the second impurity region having a relatively high impurity concentration is disposed adjacent to the first portion of the first gate insulating layer, i.e., adjacent to a portion having a relatively small thickness, a tunneling possibility gradually increases while the breakdown voltage becomes gradually reduced. In contrast, regions E-G gradually increase from FIG. 4A toward FIG. 4F, confirming that the tunneling possibility becomes smaller and the breakdown voltage increases.

FIGS. 5A through 5F illustrate electric field distributions at various regions of the substrate, i.e., regions s1, s2, s3, s4, s5, and s6 in Table 1. In detail, FIGS. 5A through 5F illustrate SEM images of electric field distributions at regions s1, s2, s3, s4, s5, and s6. Here, regions A-C, i.e., red color series regions, represent high electric field intensities, and regions E-G, i.e., blue color series regions, represent low electric field intensities.

Figure 5A:
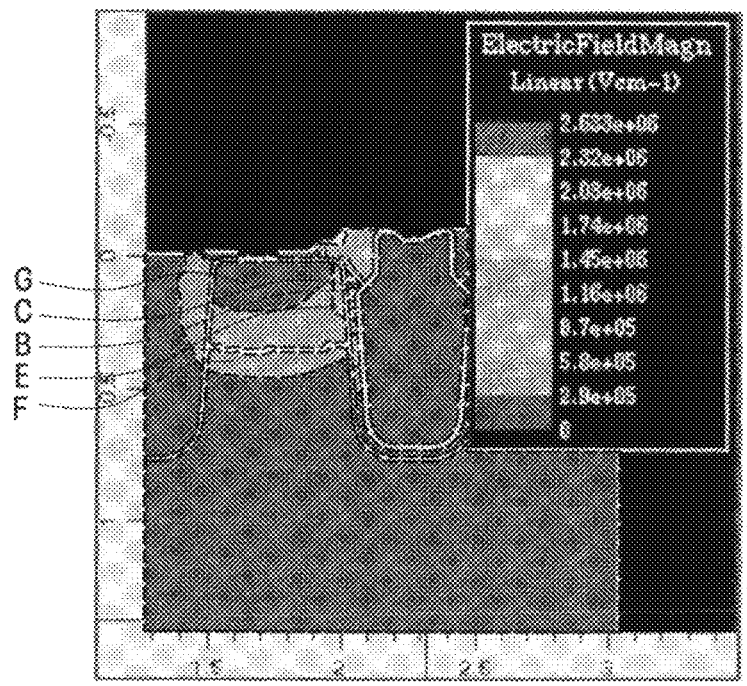
Figure 5B:
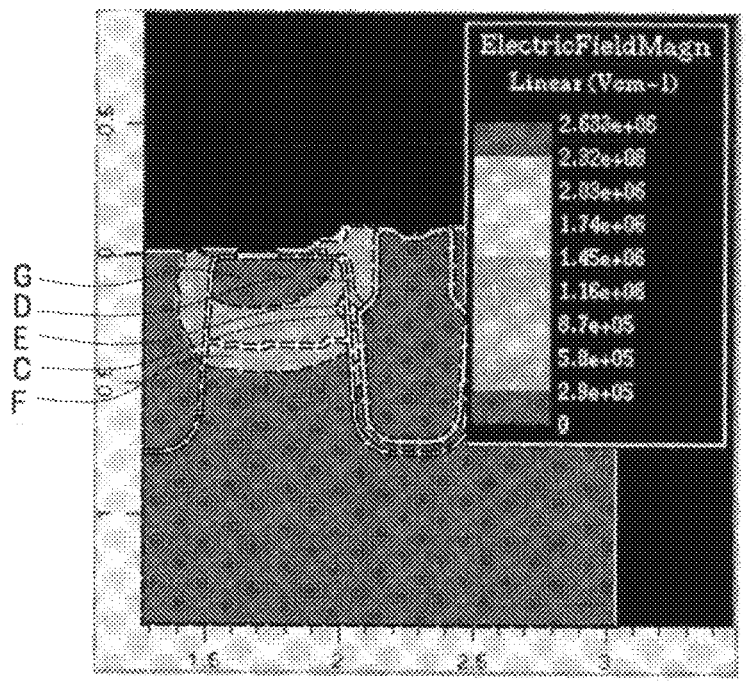
Figure 5C:
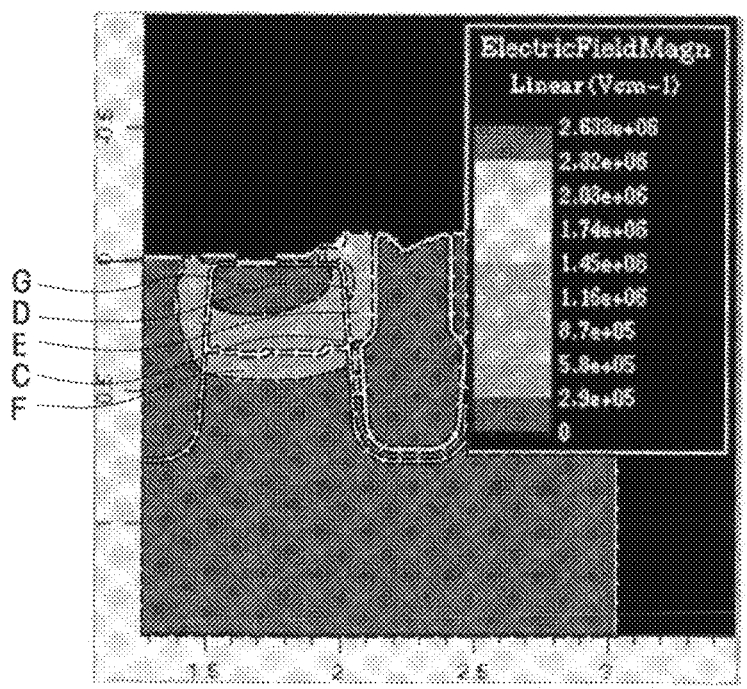
Figure 5D:
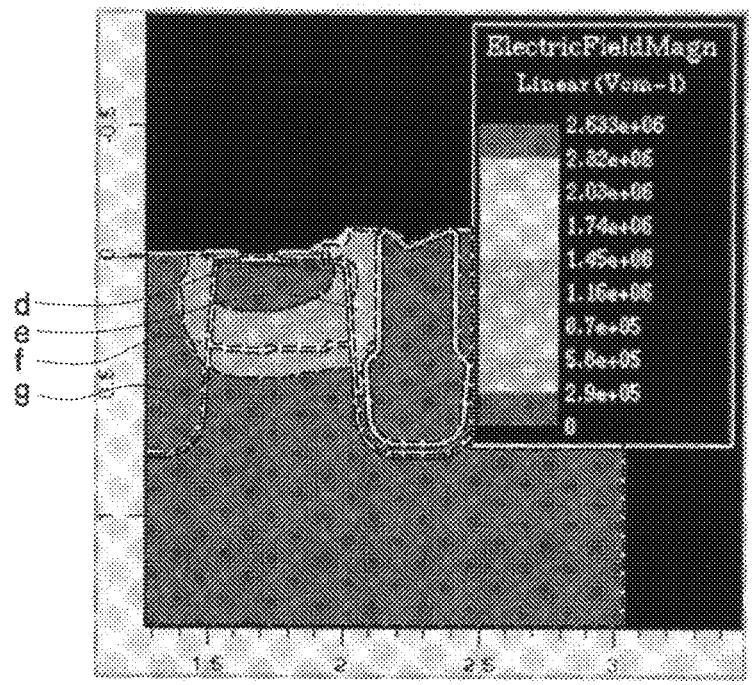
Figure 5E:
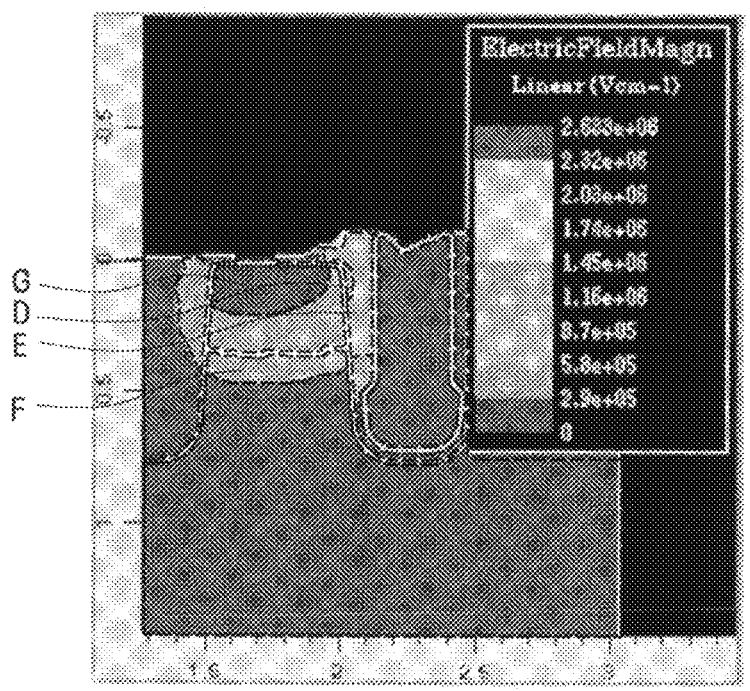
Figure 5F:
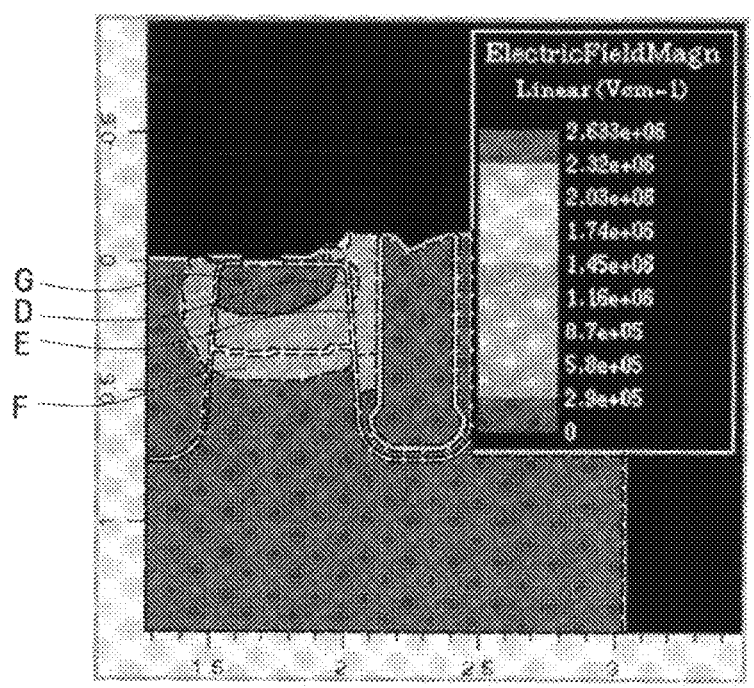
Figure 6:
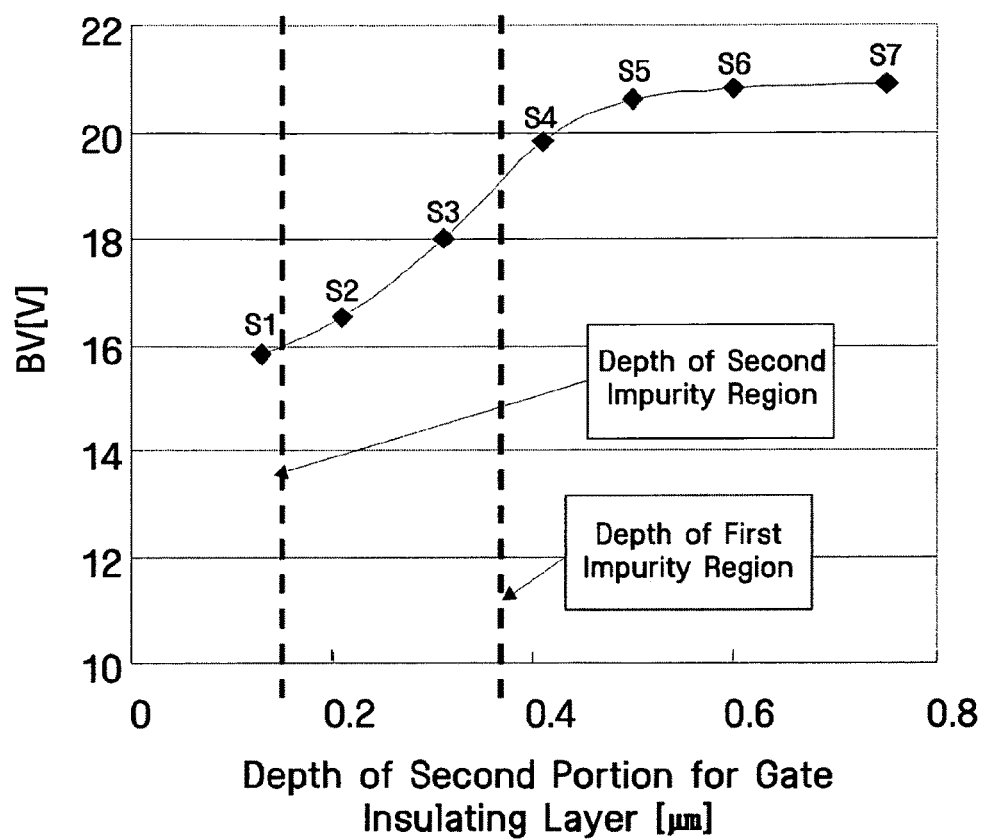
FIG. 6 illustrates a graph of breakdown voltage variation according to different depths of a second portion of an insulating gate.

As illustrated in FIG. 5A, regions A and B are formed around the interfacial area between the first and second portions of the first gate insulating layers. That is, the electric fields are concentrated at region s1, and it is expected that the breakdown voltage characteristics may deteriorate at the region s1. Regions E-G gradually increase, i.e., and get darker, from FIG. 5A toward FIG. 5F, suggesting that electric field concentrated regions are reduced and the breakdown voltages increase gradually from the region s1 toward the region s6.

As confirmed in FIG. 6 and Table 1, the breakdown voltages increased gradually from the region s1 toward the region s7, and the breakdown voltages were saturated at the regions s5 through s7. In consideration of electrical characteristics, e.g., the threshold voltage Vth and/or the breakdown voltage BV, the semiconductor device according to example embodiments demonstrated overall improved electrical characteristics, i.e., good breakdown voltage (BV) characteristics, in regions s5 through region s6. Further, region s7 exhibited poor threshold voltage (Vth) characteristic.

In order to achieve good electrical characteristics of the semiconductor device, a ratio of the third depth h3 to the first depth h1 may be in a range of about 0.67 to about 0.8. In addition, the bottom surface 161 of the second impurity region 160 may be disposed above the interfacial area 131 between the first and second portions 121 and 130 of first gate insulating layers. That is, the second depth h2 may be about 0.32 μm to about 0.42 μm. That is, in order to achieve good electrical characteristics of the semiconductor device, the bottom of the second impurity region 160 may be disposed to correspond, e.g., be adjacent to horizontally, to the second portion 130 of first gate insulating layer, while the second portion 130 having a relatively large second thickness d2.

Hereinafter, a method of fabricating the semiconductor device according to a second embodiment will be described in detail with reference to FIG. 1 and FIGS. 7 through 20. FIGS. 7 through 20 illustrate cross-sectional views of stages in a process of fabricating a semiconductor device according to a second embodiment.

Figure 7:
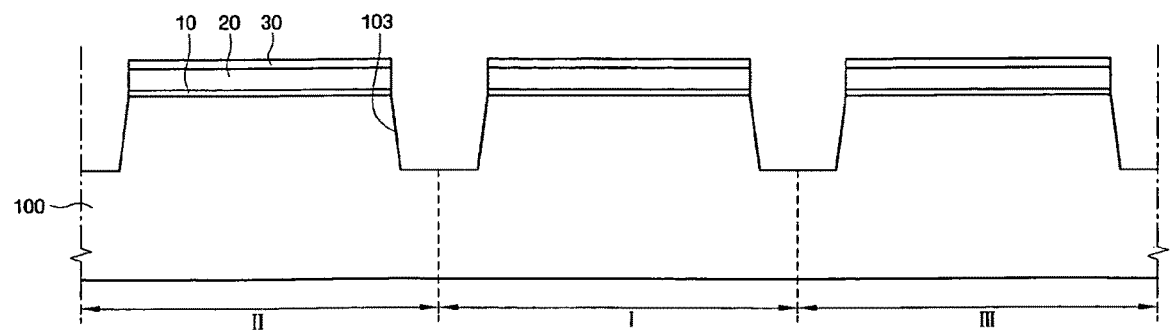
FIGS. 7 through 20 illustrate cross-sectional views of stages in a process of fabricating a semiconductor device according to an example embodiment.

Referring to FIG. 7, a pad oxide film 10 may be formed on the substrate 100. The pad oxide film 10 may be formed of an MTO (Medium Temperature Oxide) layer formed at a temperature of approximately 400° C. by, e.g., an oxidation process. The pad oxide film 10 may be formed to a thickness of about 100 Å.

Mask layers 20 and 30 may be formed on the pad oxide film 10. The mask layers 20 and 30 may be formed by depositing, e.g., SiN and SiON, using, e.g., chemical vapor deposition (CVD).

Subsequently, the pad oxide film 10 and the mask layers 20 and 30 may be patterned. Then, the substrate 100 may be etched using the patterns as etch masks to form isolation-region reserve trenches 103. Accordingly, potential regions for the first region I, the second region II, and the third region III may be defined in the substrate 100.

Figure 8:
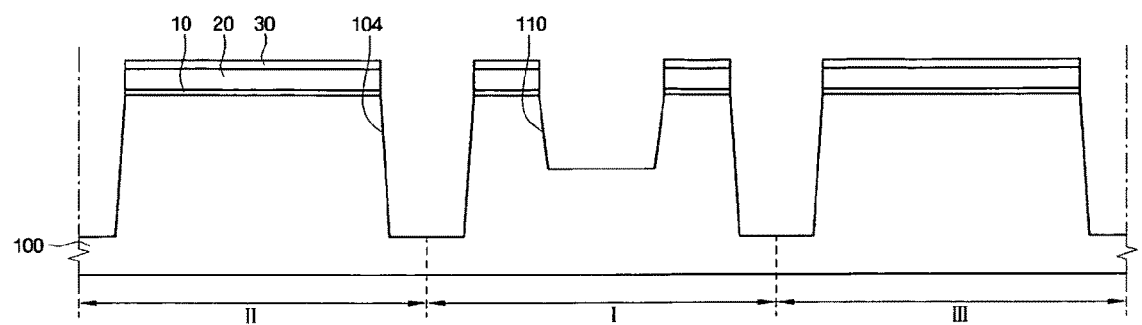

Next, referring to FIG. 8, the pad oxide film 10 and the mask layers 20 and 30 may be patterned using a photoresist pattern (not shown) to define a potential region for the recessed trench 110. The isolation-region reserve trench 103 and the substrate 100 may be etched to form an isolation-region trench 104. The recessed trench 110 and the isolation-region trench 104 may be formed simultaneously. The isolation-region trench 104 may define the first region I, the second region II, and the third region III in the substrate 100. The recessed trench 110 may be formed in the first region I. It is noted that the isolation-region reserve trench 103 may be formed, and then, may be additionally etched to simultaneously form the isolation-region trench 104 and the recessed trench 110, thereby preventing a Si fence from being generated between the recessed trench 110 and the isolation-region trench 104. In this case, a depth of the isolation-region trench 104 may be greater than that of the recessed trench 110, thereby reducing a coupling phenomenon between discrete regions.

Figure 9:
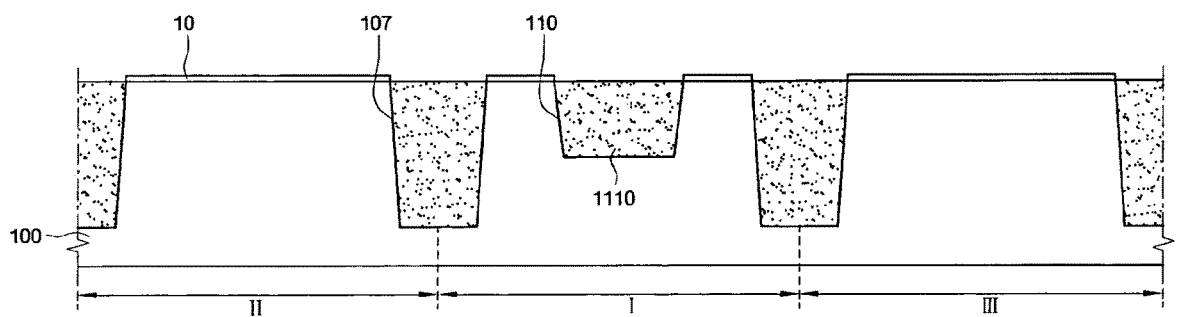

Referring to FIG. 9, an insulating layer 1110 may be simultaneously filled in the recessed trench 110 and the isolation-region trench 104. In detail, an insulating layer for STI (Shallow Trench Isolation) or FOX (Field Oxide) may fill the substrate 100, the recessed trench 110, and the isolation-region trench 104. A CMP (Chemical Mechanical Planarization) process may then be performed on the resultant product to form the isolation region 107 and the recessed trench 110 filled with the insulating layer 1110. In this case, the mask layers 20 and 30 may also be removed.

Figure 10:
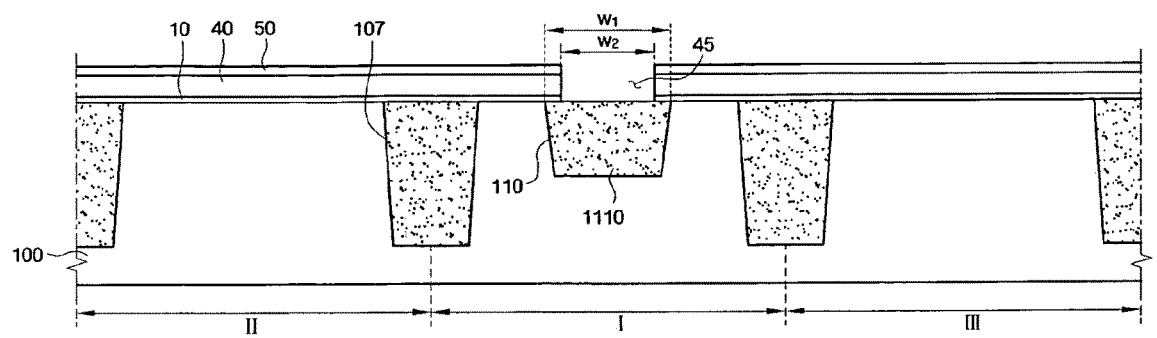

Next, referring to FIG. 10, impurity ions may be doped into the first region I, the second region II, and the third region III to form a well (not shown). Next, hard mask layers 40 and 50 made of, e.g., SiN and SiON, respectively, may be blanket deposited on the pad oxide film 10 to form an opening 45 having a width w2 smaller than a width w1 of the recessed trench 110.

Figure 11:
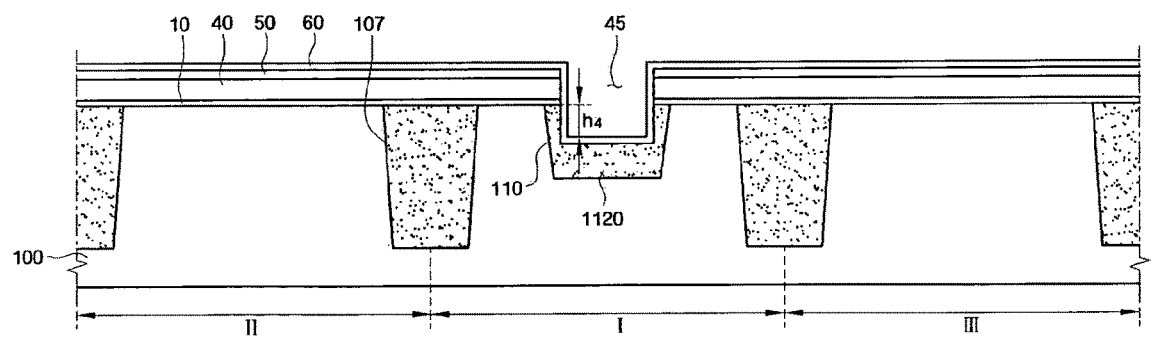

Referring to FIG. 11, a portion of the insulating layer 1110 corresponding to the opening 45 may be removed using the hard mask layers 40 and 50. In other words, the opening 45 may be expanded into the insulating layer 1110 to have the width w2 and a depth h4 smaller than a depth of the recessed trench 110. A nitride layer 60 may be formed on the hard mask layers 40 and 50, and may be formed conformally in the recessed trench 110, i.e., on a remainder insulating layer 1120 at the depth h4. The nitride layer 60 may be formed to a thickness of, e.g., about 100 Å to about 200 Å.

Figure 12:
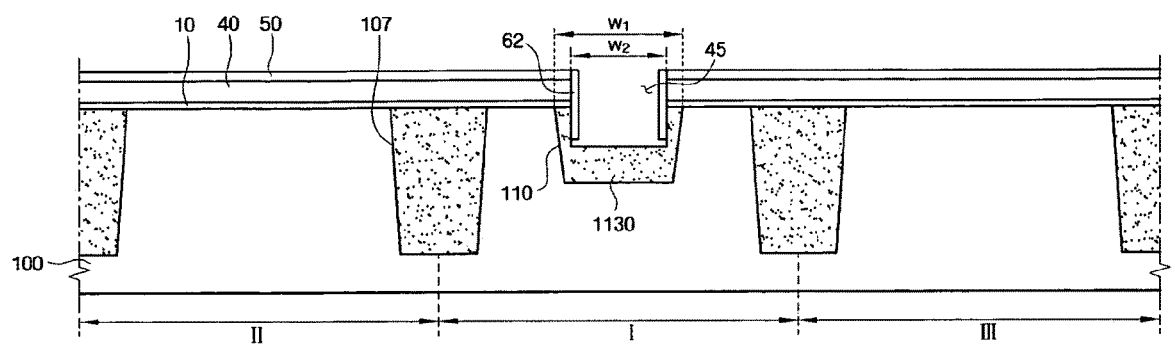

Referring to FIGS. 11 and 12, the nitride layer 60 may be etched back to expose a surface of an insulating layer 1130 in the recessed trench and a nitride layer 62, e.g., remaining only, on sidewalls of the hard mask layers 40 and 50, sidewalls of the pad oxide film 10, and internal sidewalls of the insulating layer 1130. In addition, the nitride layer 60 may also be removed from the upper surface of the substrate 100.

Figure 13:
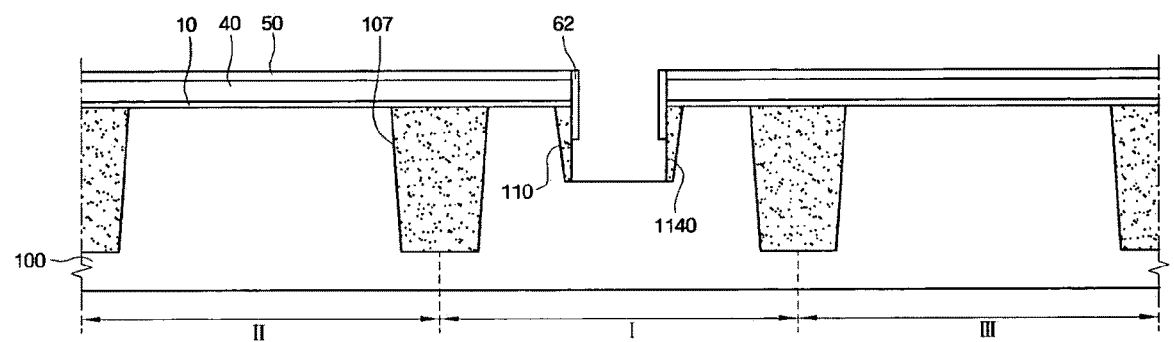

Next, referring to FIGS. 12 and 13, a lower region of the insulating layer 1130, i.e., a region exposed through the opening 45, may be etched using the nitride layer 62 and the hard mask layers 40 and 50 as etch masks, defining insulating layers 1140, i.e., layers that remain only on a portion of the bottom surface and sidewalls of the recessed trench 110. Since the nitride layer 62 has high etching selectivity with respect to the insulating layer 1130, it may not be etched. In addition, the insulating layers 1140 disposed on the sidewalls of the recessed trench 110 covered by the nitride layer 62, i.e., between the nitride layer 62 and sidewalls of the recessed trench 110, may not be etched either. In this case, the etching may be performed by anisotropic dry etching. It is noted that portions of the insulating layers 1140 disposed beyond the width w2 of the opening 45 may not be etched even if they are not directly covered by the nitride layer 62.

Figure 14:
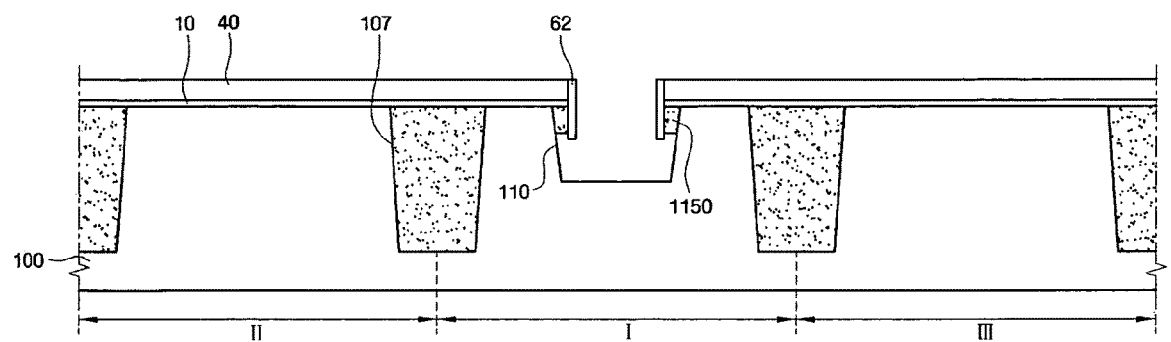

Referring to FIGS. 13 and 14, the insulating layers 1140 disposed at lower portions of the sidewalls of the recessed trench 110 may be wet etched using the nitride layer 62 as an etch mask. Since the wet etching is performed by isotropical etching, the insulating layers 1140, except the second-portion reserve part 1150 directly covered by the nitride layer 62, may be completely removed. Next, the upper hard mask layer 50 may be removed.

Figure 15:
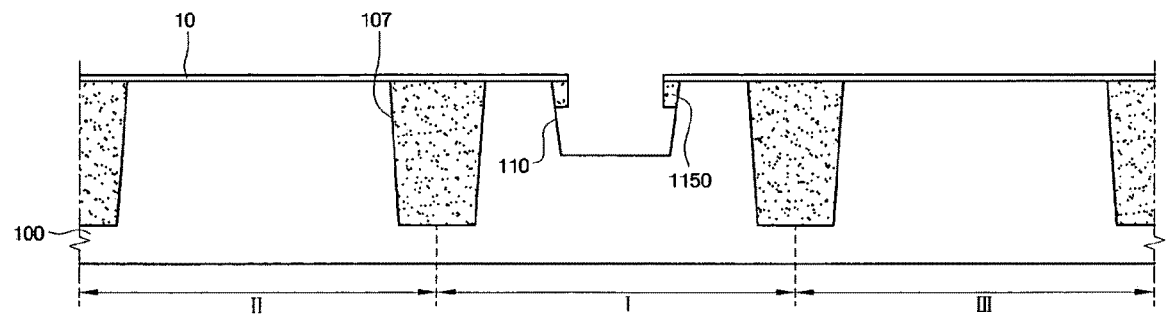

Referring to FIGS. 14 and 15, the hard mask layer 40 and the nitride layer 62 may be etched for removal.

Figure 16:
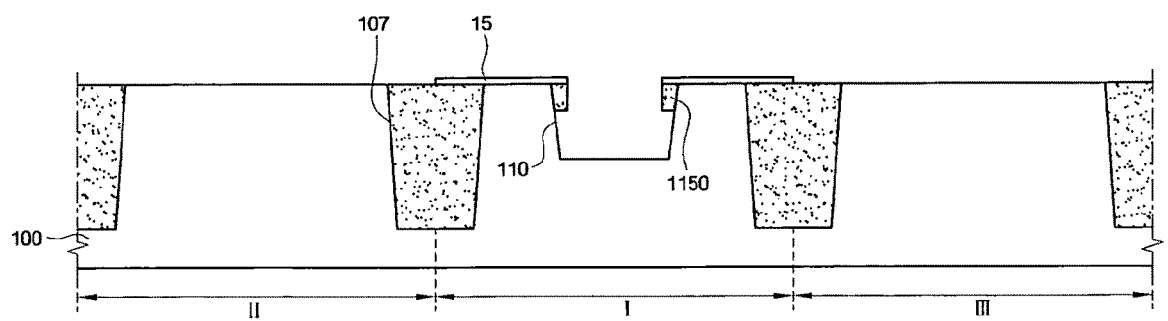

Referring to FIGS. 15 and 16, the pad oxide film 10 may be etched, so only the pad oxide layer 15 in the first region I may remain. That is, the pad oxide film 10 in the second region II and the third region III may be removed.

Figure 17:
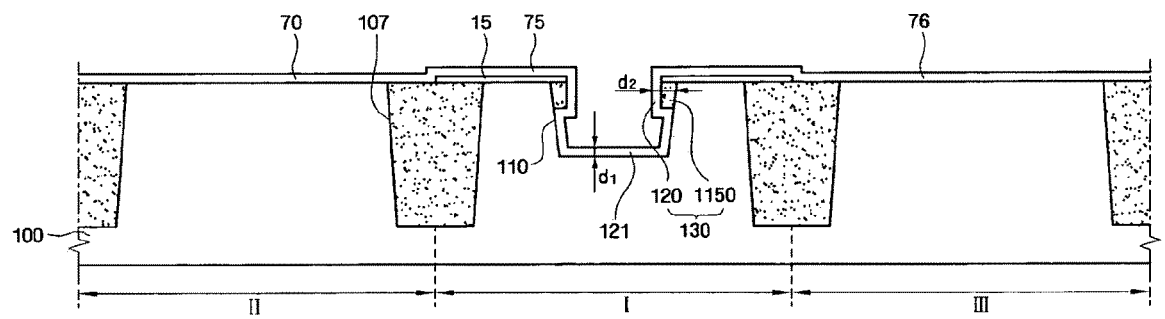

Referring to FIGS. 16 and 17, high voltage insulating layers 70, 75, 76, 120, and 121 may be formed to a first thickness d1 to cover a surface of the substrate 100, the second-portion reserve part 1150, and the lower portions and bottom surface of the recessed trench 110. In the first region I, the high voltage insulating layers 70, 75, 76, 120, and 121 may be formed on the paid oxide layer 15. The high voltage insulating layers 70, 75, 76, 120, and 121 may be formed by CVD. Accordingly, first, second, third, and fourth portions of the first gate insulating layer 121, 130, 15, and 75 may be formed. The first portion 121 may cover the lower portions, i.e., lower portion of sidewalls of the recessed trench 110, and bottom surface of the recessed trench 110, and may have the first thickness d1. The second portion 130 may cover the upper portions of the sidewalls of the recessed trench 110, and may have the second thickness d2 greater than the first thickness d1 in the recessed trench 110.

Since the pad oxide layer 15 is formed on the substrate 100 of the first region I, a combined thickness of the insulating layers 15 and 70 on the surface of the substrate 100 in the first region I may be greater than that of the high voltage insulating layer 70 formed on the surface of the substrate 100 of the third region III. The thickness of the high voltage insulating layer 70 formed on the surface of the substrate 100 of the third region III may substantially equal the first thickness d1 of the first portion 121 in the recessed trench 110.

Figure 18:
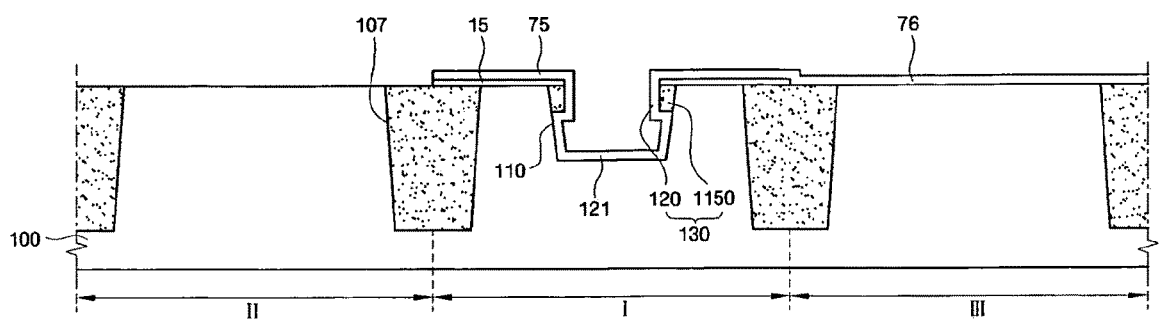

Referring to FIGS. 17 and 18, the high voltage insulating layer 70 in the second region II may be removed to allow the high voltage insulating layers 75, 76, 120, and 121 to remain only on the surface of the substrate 100 in the first region I, the third region III, and inside the recessed trench 110.

Figure 19:
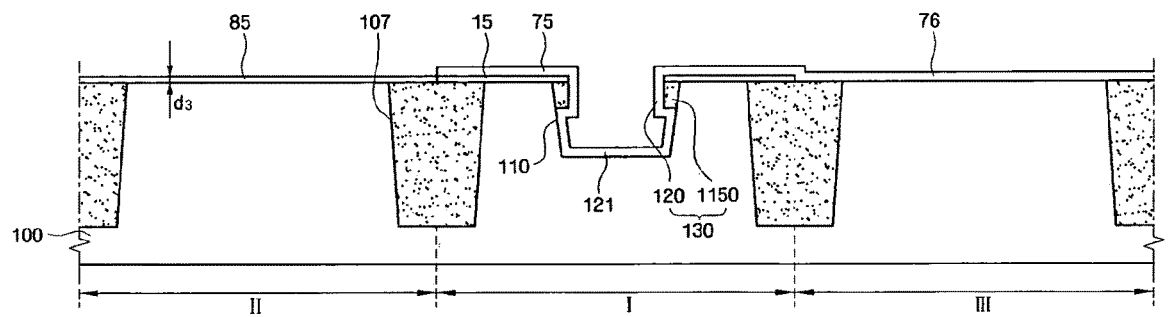

Referring to FIGS. 18 and 19, the second gate insulating layer 85, e.g., formed of a low voltage insulating layer, may be formed in the second region II to have a third thickness d3. The third thickness d3 of the second gate insulating layer 85 may be smaller than the first thickness d1 of the high voltage insulating layer 75. The low voltage insulating layer 85 may be formed by, e.g., thermal oxidation.

Figure 20:
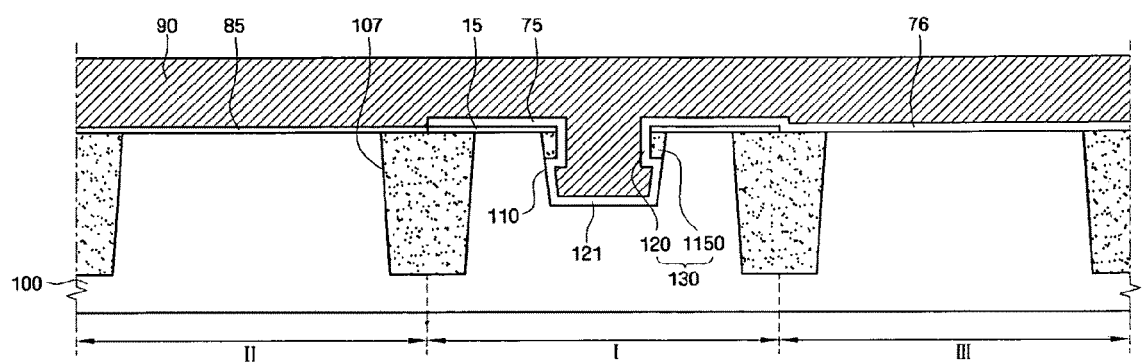

Referring to FIGS. 19 and 20, a conductive material 90 may be deposited on the high voltage insulating layers 75 and 76 and the second gate insulating layer 85. Here, the conductive material 90 may also fill the inside of the recessed trench 110.

Finally, referring to FIG. 20 with FIG. 1, the conductive material 90 may be patterned to form the high voltage recess gate electrode 140 in the first region I, the low voltage gate electrode 240 in the second region II, and the high voltage gate electrode 340 in the third region III. Subsequently, the first impurity region 150 having a first concentration may be formed at opposing sides of the high voltage recess gate electrode 140 in the first region I. The first impurity region 150 may be formed to correspond to the first portion 121 of the first gate insulating layer. Next, the spacers 170, 270, and 370 may be formed at opposing sides of each sidewall of the high voltage recess gate electrode 140 in the first region I, the low voltage gate electrode 240 in the second region II, and the high voltage gate electrode 340 in the third region III, respectively.

Next, impurities may be ion-implanted into opposing sides of the respective the spacers 170, 270, and 370 formed in the high voltage recess gate electrode 140 in the first region I, the low voltage gate electrode 240 in second region II, and the high voltage gate electrode 340 in the third region III, thereby forming the second impurity region 160, the third impurity region 260, and the fourth impurity regions 350 and 360, respectively.

Hereinafter, a method of fabricating the semiconductor device according to a third embodiment will be described in detail with reference to FIG. 1 and FIGS. 21 through 24. FIGS. 21 through 24 illustrate cross-sectional views of stages in a process of fabricating a semiconductor device according to a third embodiment.

Figure 21:
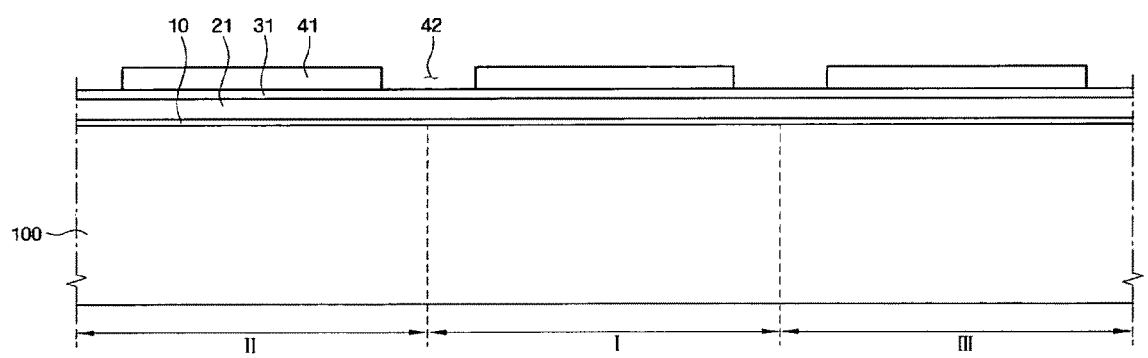
FIGS. 21 through 24 illustrate cross-sectional views of stages in a process of fabricating a semiconductor device according to another example embodiment.

Referring to FIG. 21, a pad oxide film 10 and etch rate controlling layers 21, 31, and 41 may be sequentially formed on the substrate 100. The pad oxide film 10 may be formed of an MTO (Medium Temperature Oxide) layer formed at a temperature of approximately 400° C. by, e.g., an oxidation process. The pad oxide film 10 may be formed to a thickness of approximately 100 Å.

Mask layers 20 and 30 may be formed on the pad oxide film 10. The mask layers 20 and 30 may be formed by depositing, e.g., SiN and SiON, using, e.g., chemical vapor deposition (CVD).

Subsequently, the pad oxide film 10 and the mask layers 20 and 30 may be patterned, and the substrate 100 may then be etched using the patterns as etch masks to form an isolation-region reserve trench 103. Accordingly, potential regions for the first region I, the second region II, and the third region III may be defined in the substrate 100.

The etch rate controlling layers 21, 31, and 41 may be formed by stacking two or more different materials one on another. The etch rate controlling layers 21, 31, and 41 may be formed by sequentially depositing an etch-rate-controlling first nitride layer 21, an etch-rate-controlling oxide layer 31, and an etch-rate-controlling second nitride layer 41. The etch-rate-controlling first nitride layer 21 and the etch-rate-controlling second nitride layer 41 may be formed of the same material, e.g., SiN. The etch-rate-controlling first nitride layer 21 may have etching selectivity with respect to the substrate 100. The etch-rate-controlling first nitride layer 21 and the etch-rate-controlling oxide layer 31 may correspond to the mask layers 20 and 30 of the previous embodiment.

Next, the etch-rate-controlling second nitride layer 41 may be patterned using a photoresist pattern (not shown) as an etch mask to form a first opening 42 where the isolation-region trench (see 105 of FIG. 24) is to be formed. Accordingly, potential regions for the first region I, the second region II, and the third region III may be defined in the substrate 100.

Figure 22:
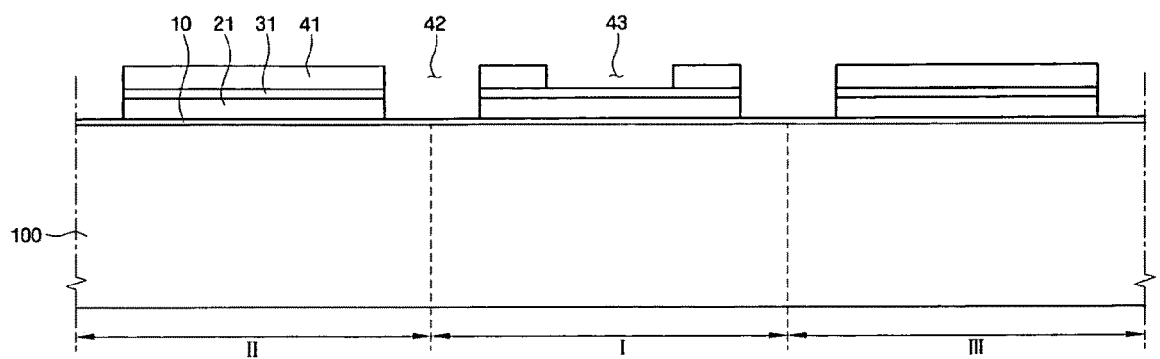
Figure 23:
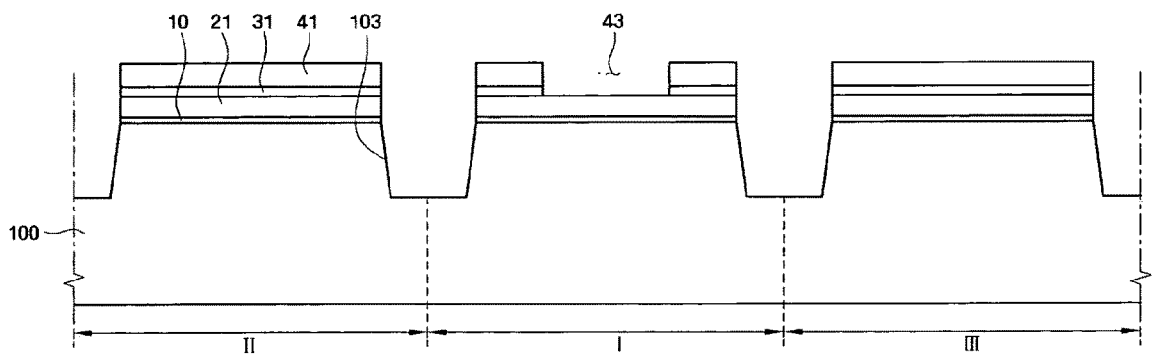

Referring to FIG. 23, an etching process may be continuously performed using the photoresist pattern shown in FIG. 22 to etch the pad oxide film 10 and the substrate 100, thereby forming the isolation-region reserve trench 103. In this case, the etch-rate-controlling oxide layer 31 of the second opening 43 may also be etched for removal. Here, the etch-rate-controlling second nitride layer 41 may also be partially removed and a thickness thereof may decrease. However, the substrate 100 in the second opening 43 may not be etched. This is because the etching selectivity of the substrate 100 with respect to the etch-rate-controlling second nitride layer 41 may be high. However, the etch-rate-controlling second nitride layer 41 exposed by the second opening 43 may be barely etched by the etching selectivity while forming the isolation-region reserve trench 103 by etching the substrate 100. Accordingly, the isolation-region trench 105 to be formed later may be formed to have a depth greater than that of the recessed trench 110.

Figure 24:
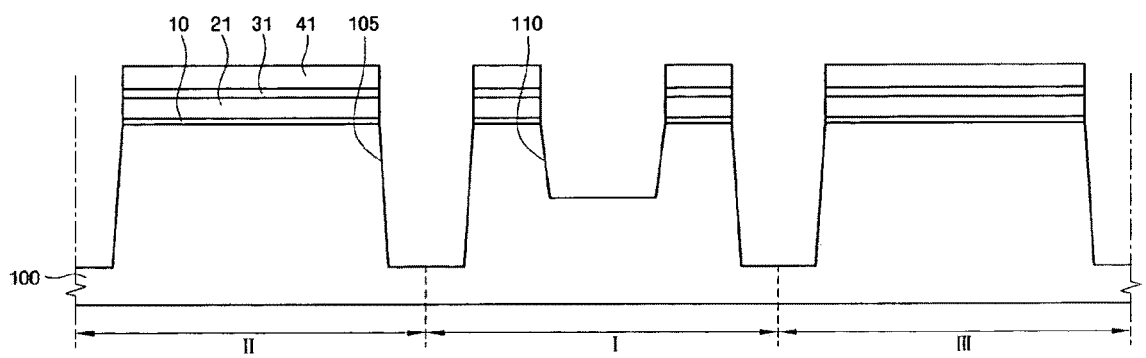

Referring to FIG. 24, the etch-rate-controlling first nitride layer 21 of the second opening 43 may be removed, and the first opening 42 and the second opening 43 may be simultaneously etched. Accordingly, the isolation-region trench 105 may be formed at a lower portion of the first opening 42, and the recessed trench 110 may be formed at a lower portion of the second opening 43. In this case, the isolation-region trench 105 and the recessed trench 110 may be simultaneously formed, thereby preventing a Si fence from being generated between the recessed trench 110 and the isolation-region trench 105.

Next, the etch-rate-controlling second nitride layer 41 may be removed. Subsequently, the semiconductor device illustrated in FIG. 1 may be completed through the processes described with reference to FIGS. 8 through 20.

Hereinafter, a method of fabricating the semiconductor device according to a fourth embodiment will be described in detail with reference to FIG. 1 and FIGS. 25 through 36. FIGS. 25 through 36 illustrate cross-sectional views of stages in a process of fabricating a semiconductor device according to a fourth embodiment.

Figure 25:
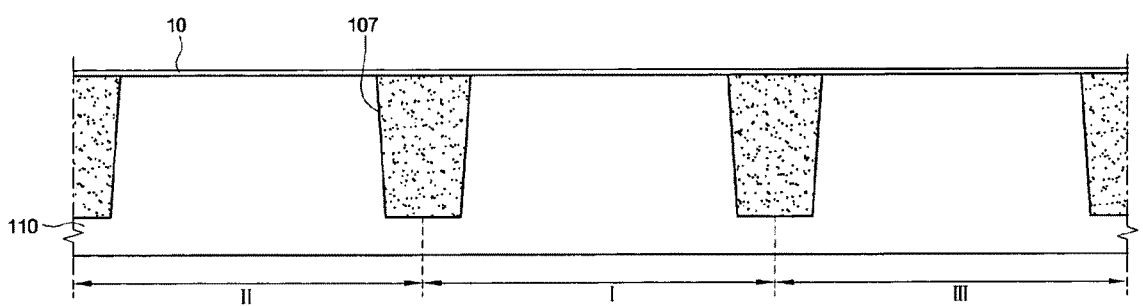
FIGS. 25 through 36 illustrate cross-sectional views of stages in a process of fabricating a semiconductor device according to another example embodiment.

Referring to FIG. 25, an isolation region 107 may be first formed, and the first region I, the second region II, and the third region III may then be defined in the substrate 100. It is noted that the isolation region 107 may be formed prior to formation of the recessed trench 110, as compared to the embodiments described previously with reference to FIGS. 7-24.

Next, a pad oxide film 10 may be formed on the substrate 100 by, e.g., an oxidation process.

Figure 26:
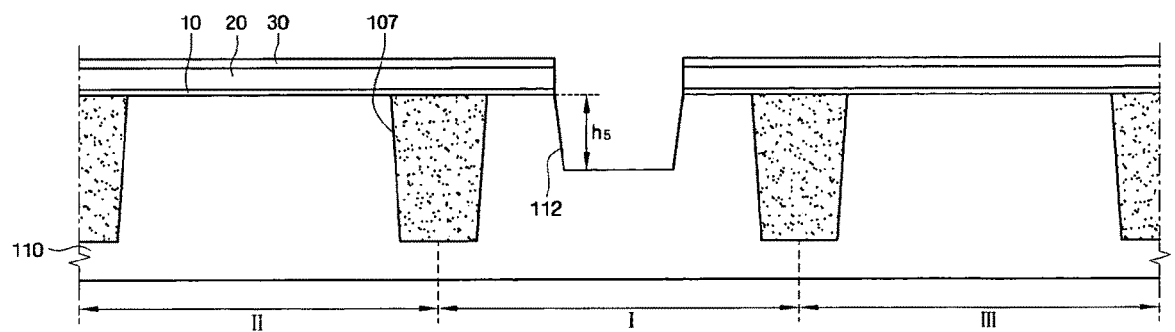

Referring to FIG. 26, mask layers 20 and 30 may be formed on the pad oxide film 10 and patterned to define a potential region for a recessed trench (see 114 of FIG. 29) in the first region I. Next, a reserve recessed trench 112 may be formed to have a depth h5 using the mask layers 20 and 30 as etch masks. The depth h5 of the reserve recessed trench 112 may be smaller than a depth of the recessed trench.

Figure 27:
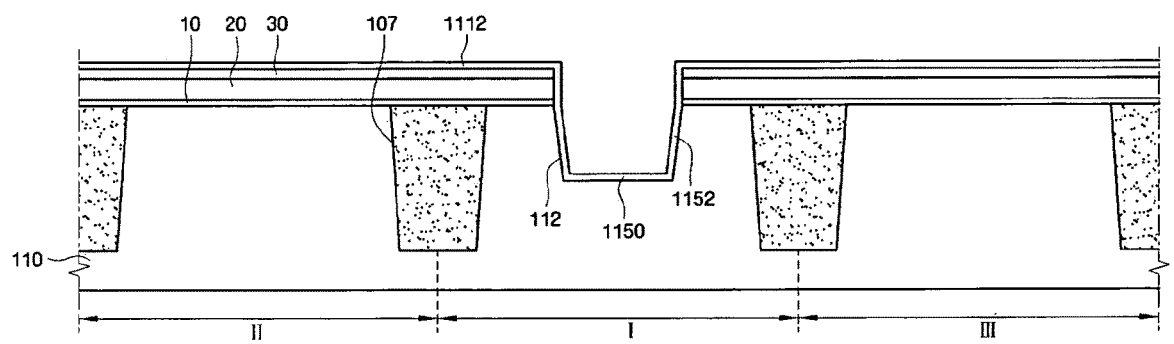

Referring to FIG. 27, reserve insulating layers 1112, 1150, and 1152 may be formed conformally on a surface of the substrate 100 and on the reserve recessed trench 112. The reserve insulating layers 1112, 1150, and 1152 may be formed by growing an MTO (Medium Temperature Oxide) layer or by CVD.

Figure 28:
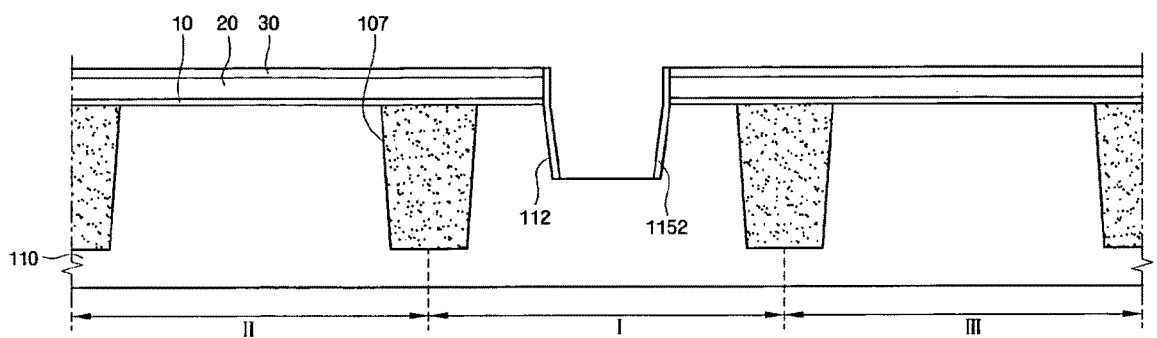

Referring to FIGS. 27 and 28, the reserve insulating layers 1112, 1150, and 1152 may be etched back to remove the reserve insulating layers 1112 and 1150 disposed on a bottom surface of the reserve recessed trench 112 and the surface of the substrate 100, while allowing the reserve insulating layer 1152 to remain only in the reserve recessed trench 112.

Figure 29:
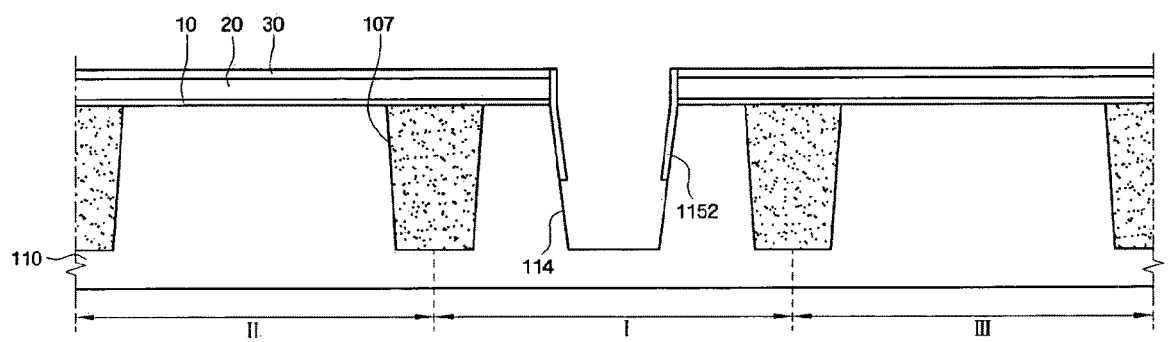

Referring to FIGS. 28 and 29, the bottom surface of the reserve recessed trench 112 may be etched using the mask layers 20 and 30 as etch masks to form the recessed trench 114. In this case, the reserve insulating layer 1152 may remain on the upper portions of the sidewalls of the recessed trench 114.

Figure 30:
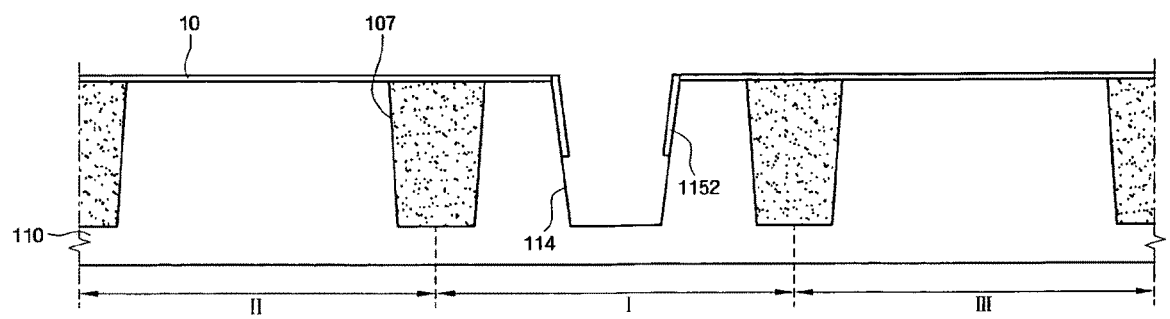

Referring to FIGS. 29 and 30, the mask layers 20 and 30 may be removed.

Figure 31:
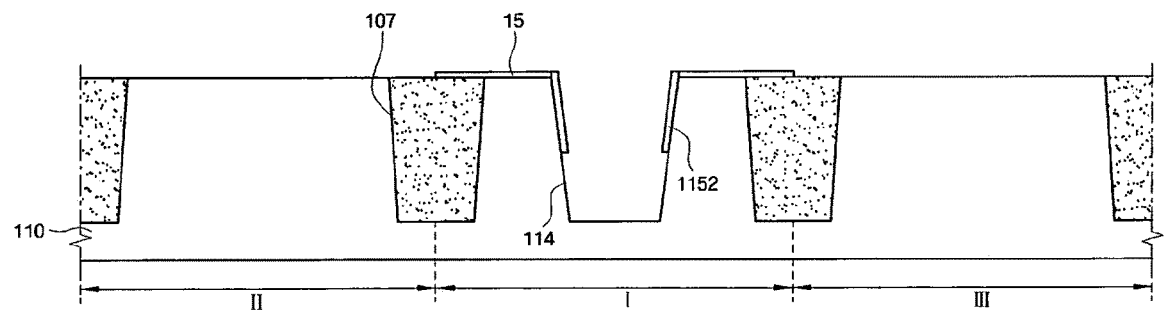

Referring to FIGS. 30 and 31, the pad oxide film 10 in the second region II and the third region III may be removed using a photoresist pattern (not shown). Accordingly, paid oxide layer 15 may remain in the first region I.

Figure 32:
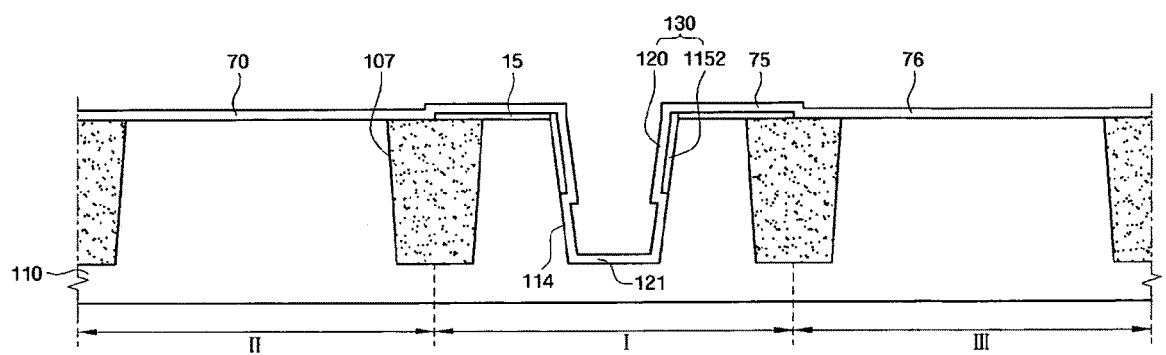

Referring to FIGS. 31 and 32, high voltage insulating layers 70, 75, 76, 120, and 121 may be formed to cover a surface of the substrate 100, the paid oxide layer 15, the second-portion reserve part 1150, and the lower portions and bottom surface of the recessed trench 114. The high voltage insulating layers 70, 75, 76, 120, and 121 may be formed to have the same thicknesses by the same process as in the previous embodiment.

Figure 33:
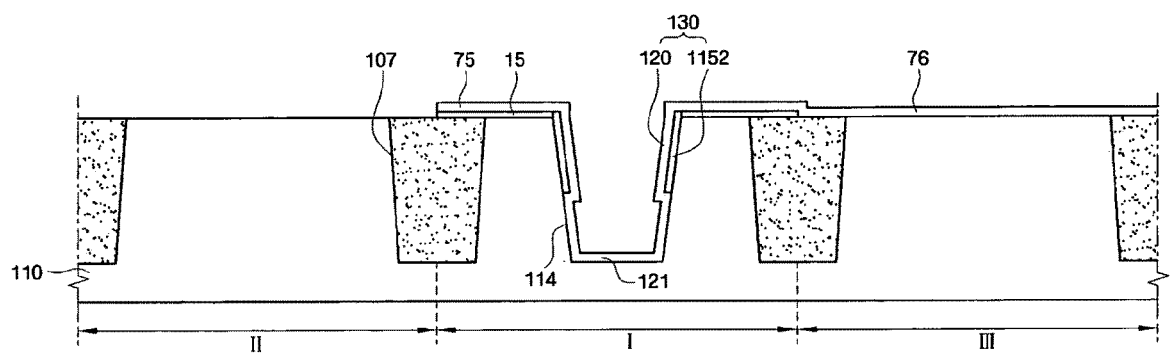

Referring to FIGS. 32 and 33, the high voltage insulating layer 70 in the second region II may be removed to allow the high voltage insulating layers 70, 76, 120, and 121 to remain only on the surface of the substrate 100 in the first region I and the third region II and within the recessed trench 114.

Figure 34:
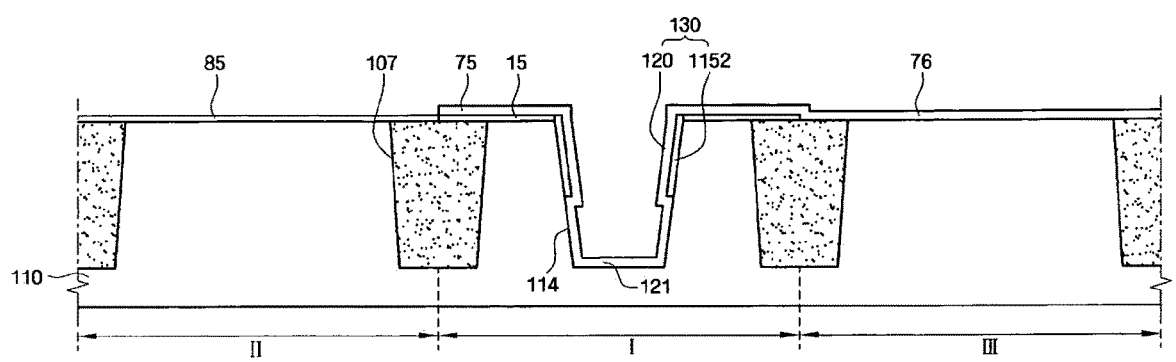

Next, referring to FIGS. 33 and 34, the second gate insulating layer 85, e.g., including a low voltage insulating layer, may be formed in the second region II. The process employed for forming the second gate insulating layer 85 and the thickness of the second gate insulating layer 85 may be the same as those of the previous embodiment.

Figure 35:
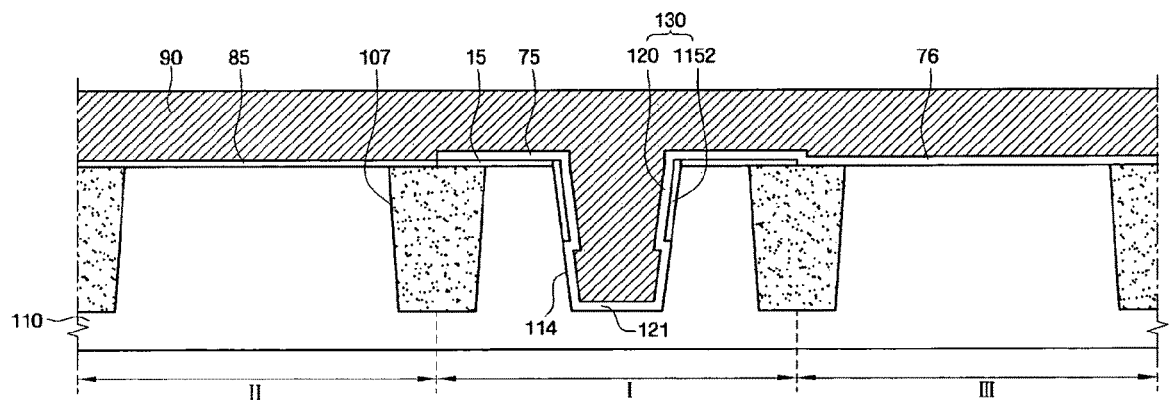

Referring to FIGS. 34 and 35, the conductive material 90 may be deposited on the high voltage insulating layers 70 and 76 and on the second gate insulating layer 85.

Figure 36:
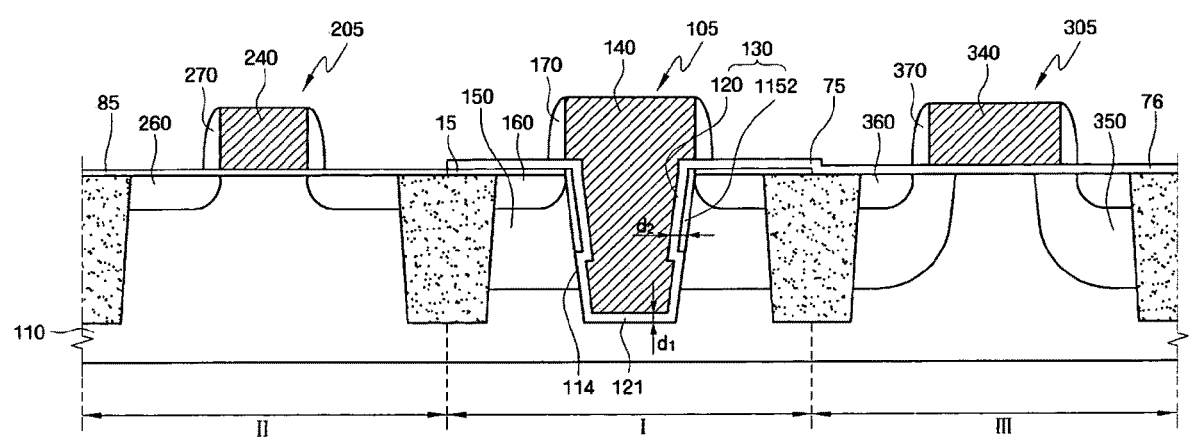

Finally, referring to FIGS. 35 and 36, the conductive material 90 may be patterned to form the high voltage recess gate electrode 140 in the first region I, the low voltage gate electrode 240 in the second region II, and the high voltage gate electrode 340 in the third region III, respectively. Subsequently, the first impurity region 150 having a first concentration may be formed at opposing sides of the high voltage recess gate electrode 140 in the first region I. The semiconductor device according to the present embodiment may have substantially the same configuration as that according to the previous embodiment, except that the reserve insulating layer 1152 may be conformally formed at upper portions of sidewalls of the recessed trench 114 in the first region I, and a depth of the recessed trench 114 may be substantially equal to that of the isolation region 107.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a first region, a second region, and a third region separated from each other by an isolation region on a substrate;
   a recessed trench in the first region;
   a high voltage recess channel transistor comprising:
      a first gate insulating layer in the recessed trench, the first gate insulating layer having a first portion with a first thickness and a second portion with a second thickness greater than the first thickness,
      a high voltage recess gate electrode on the first gate insulating layer and filling the recessed trench,
      a first impurity region having a first concentration and disposed at opposing sides of the high voltage recess gate electrode, and
      a second impurity region having a second concentration greater than the first concentration and disposed on the first impurity region to correspond to the second portion of the gate insulating layer;
   a low voltage planar channel transistor comprising:
      a second gate insulating layer on a surface of the second region of the substrate and having a third thickness smaller than the first thickness,
      a low voltage gate electrode on the second gate insulating layer, and
      a third impurity region at opposing sides of the low voltage gate electrode; and
   a high voltage planar channel transistor in the third region of the substrate.

2. The semiconductor device as claimed in claim 1, wherein the high voltage planar channel transistor comprises:
   a third gate insulating layer on a surface of the third region of the substrate and having the first thickness,
   a high voltage gate electrode on the third gate insulating layer, and
   a fourth impurity region at opposing sides of the high voltage gate electrode.

3. The semiconductor device as claimed in claim 1, wherein a bottom surface of the second impurity region is disposed above an interfacial area between the first and second portions of the first gate insulating layer.

4. The semiconductor device as claimed in claim 3, wherein a distance between the interfacial area and the bottom surface of the second impurity region is about 0.32 μm to about 0.42 μm.

5. The semiconductor device as claimed in claim 1, wherein a ratio of a depth of the second portion of the first gate insulating layer to a depth of the recessed trench is about 0.67 to about 0.8, the depth of the second portion being measured from an upper surface of the substrate to a bottom surface of the second portion, and the depth of the recessed trench being measured from the upper surface of the substrate to a bottom surface of the recessed trench.

6. The semiconductor device as claimed in claim 1, wherein a bottom surface of the first impurity region is disposed below an interfacial area between the first and second portions.

* * * * *